(12) United States Patent
Kang et al.

(10) Patent No.: US 12,021,095 B2
(45) Date of Patent: Jun. 25, 2024

(54) IMAGE SENSOR AND ELECTRONIC SYSTEM INCLUDING THE SAME

(71) Applicant: SAMSUNG ELECTRONICS CO., LTD., Suwon-si (KR)

(72) Inventors: Jeongsoon Kang, Gumi-si (KR); Buil Jung, Hwaseong-si (KR); Hyunmog Park, Seoul (KR); Wonsok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 445 days.

(21) Appl. No.: 17/376,333

(22) Filed: Jul. 15, 2021

(65) Prior Publication Data
US 2022/0149092 A1 May 12, 2022

(30) Foreign Application Priority Data
Nov. 12, 2020 (KR) .................. 10-2020-0151279

(51) Int. Cl.
*H01L 27/146* (2006.01)
*H01L 29/423* (2006.01)

(52) U.S. Cl.
CPC .. *H01L 27/14614* (2013.01); *H01L 27/14621* (2013.01); *H01L 27/14627* (2013.01); *H01L 27/1463* (2013.01); *H01L 27/14636* (2013.01); *H01L 27/14664* (2013.01); *H01L 27/14645* (2013.01); *H01L 27/14689* (2013.01); *H01L 29/42356* (2013.01); *H01L 29/4236* (2013.01); *H01L 29/42372* (2013.01); *H01L 29/42376* (2013.01)

(58) Field of Classification Search
CPC ......... H01L 27/14614; H01L 29/42356; H01L 29/4236; H01L 29/42372; H01L 29/42376
See application file for complete search history.

(56) References Cited

U.S. PATENT DOCUMENTS

| | | | |
|---|---|---|---|
| 7,470,945 B2 | 12/2008 | Kao | |
| 7,589,349 B2 | 9/2009 | Hong | |
| 7,825,438 B2 | 11/2010 | Jung et al. | |
| 8,829,578 B2 | 9/2014 | Maeda | |
| 8,937,272 B2 | 1/2015 | Hynecek | |
| 9,478,570 B2 | 10/2016 | Manouvrier et al. | |
| 9,496,311 B2 | 11/2016 | Kikuchi | |
| 9,961,284 B2 | 5/2018 | Koga | |
| 10,199,423 B2 | 2/2019 | Ihara et al. | |
| 10,535,693 B2 | 1/2020 | Roy | |
| 10,566,361 B2 | 2/2020 | Wei et al. | |

*Primary Examiner* — David A Zarneke
(74) *Attorney, Agent, or Firm* — F. Chau & Associates, LLC

(57) ABSTRACT

An image sensor includes a substrate having a pixel area in which a plurality of active areas is defined. A first transistor includes a first gate electrode including a buried gate portion. The buried gate portion is buried in the substrate in a first active area selected from the plurality of active areas. A second transistor includes a second gate electrode overlapping the buried gate portion on the first active area in a vertical direction.

20 Claims, 46 Drawing Sheets

Y1 – Y1'

Y1 – Y1'

X1 – X1'

IMAGE SENSOR AND ELECTRONIC SYSTEM INCLUDING THE SAME

CROSS-REFERENCE TO RELATED APPLICATIONS

This application claims priority under 35 U.S.C. § 119 to Korean Patent Application No. 10-2020-0151279, filed on Nov. 12, 2020 in the Korean Intellectual Property Office, the disclosure of which is incorporated by reference herein in its entirety.

TECHNICAL FIELD

Embodiments of the inventive concept relate an image sensor and an electronic system including the image sensor, and more particularly, to an image sensor including a plurality of transistors and an electronic system including the image sensor.

DISCUSSION OF RELATED ART

Image sensors that acquire images and convert the acquired images into electrical signals have been used in various fields to implement various devices, such as digital cameras, camcorders, personal communication systems (PCS), game devices, security cameras, and medical micro cameras.

SUMMARY

Embodiments of the inventive concept provide an image sensor having a structure that may increase an integration density while securing stable electrical characteristics of transistors, even as image sensors become highly integrated and pixel sizes are miniaturized.

Embodiments of the inventive concept also provide an electronic system including an image sensor having a structure that may increase integration density while securing stable electrical characteristics of transistors, even as image sensors become highly integrated and pixel sizes are miniaturized.

According to an aspect of the inventive concept, there is provided an image sensor including a substrate having a pixel area in which a plurality of active areas is defined. A first transistor includes a first gate electrode including a buried gate portion. The buried gate portion is buried in the substrate in a first active area selected from the plurality of active areas. A second transistor includes a second gate electrode overlapping the buried gate portion on the first active area in a vertical direction.

According to an aspect of the inventive concept, there is provided an image sensor including a substrate including a front side surface and a back side surface, which are opposite surfaces. The substrate includes a plurality of active areas defined at positions adjacent to the front side surface between the front side surface and the back side surface. A photodiode is formed in the substrate. A source follower transistor is in a first active area selected from the plurality of active areas. The source follower transistor includes a first gate electrode. The first gate electrode includes a buried gate portion buried in the substrate and an upper gate portion in contact with the buried gate portion. The upper gate portion overlaps a first region of the buried gate portion in a vertical direction. A second transistor includes a second gate electrode overlapping a second region of the buried gate portion on the first active area in the vertical direction. A transfer transistor is formed in a second active area selected from the plurality of active areas. A floating diffusion region is formed in the second active area. The floating diffusion region is connected to the upper gate portion of the source follower transistor. A microlens covers the back side surface of the substrate.

According to an aspect of the inventive concept, there is provided an electronic system including at least one camera module including an image sensor. A processor processes image data received from the at least one camera module. The image sensor includes a substrate having a pixel area in which a plurality of active areas is defined. A first transistor includes a first gate electrode including a buried gate portion. The buried gate portion is buried in the substrate in a first active area selected from the plurality of active areas. A second transistor includes a second gate electrode overlapping the buried gate portion on the first active area in a vertical direction.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
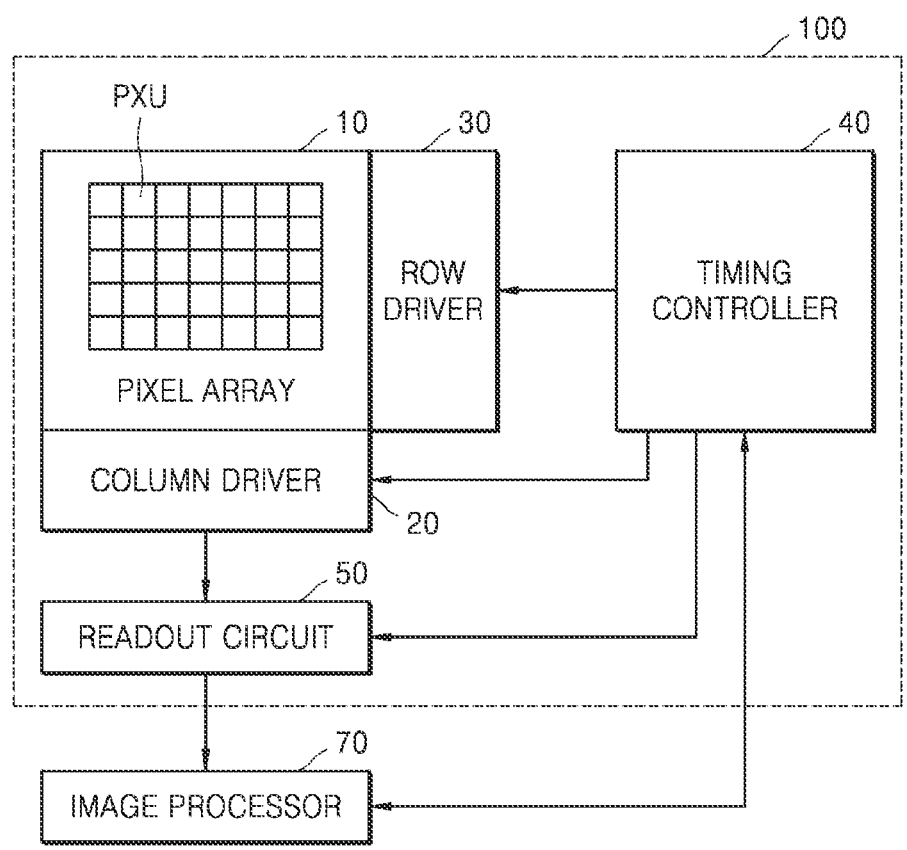
FIG. 1 is a block diagram of an image sensor according to embodiments.

Embodiments of the present inventive concept will be described more fully hereinafter with reference to the accompanying drawings. Like reference numerals may refer to like elements throughout the accompanying drawings, and duplicate descriptions thereof may omitted.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

FIG. 1 is a block diagram of an image sensor 100 according to embodiments.

Referring to FIG. 1, the image sensor 100 according to embodiments may include a pixel array 10 and circuits configured to control the pixel array 10. In example embodiments, the circuits configured to control the pixel array 10 may include a column driver 20, a row driver 30, a timing controller 40, and a readout circuit 50.

The image sensor 100 may operate according to a control command received from an image processor 70, and may convert light transmitted from an external object into an electrical signal and output the electrical signal to the image processor 70. The image sensor 100 may be a complementary metal-oxide semiconductor (CMOS) image sensor.

The pixel array 10 may include a plurality of unit pixels PXU having a two-dimensional array structure arranged in a matrix form along a plurality of rows and a plurality of columns.

Each of the plurality of unit pixels PXU may have a photodiode. The photodiode may generate electric charges by receiving light transmitted from the object. The image sensor 100 may perform an autofocus function by using a phase difference between pixel signals generated from a plurality of photodiodes included in the plurality of unit pixels PXU. Each of the plurality of unit pixels PXU may include a pixel circuit for generating a pixel signal from electric charges generated by the photodiode.

The column driver 20 may include, for example, a correlated double sampler (CDS), an analog-to-digital converter (ADC), and the like. The CDS may be connected, through columns, to a unit pixel PXU included in a row selected by a row selection signal supplied by the row driver 30 and perform correlated double sampling to detect a reset voltage and a pixel voltage. The ADC may convert the reset voltage and the pixel voltage each detected by the CDS into digital signals and transmit the digital signals to the readout circuit 50.

The readout circuit 50 may include a latch or buffer circuit, which is capable of temporarily storing digital signals, an amplifying circuit, and the like, and may temporarily store or amplify digital signals received from the column driver 20 to generate image data. The operation timing of the column driver 20, the row driver 30, and the readout circuit 50 may be determined by the timing controller 40, and the timing controller 40 may operate based on a control command transmitted from the image processor 70.

The image processor 70 may signal-process image data output from the readout circuit 50 and output the signal-processed image data to a display device, or store the signal-processed image data in a storage device such as a memory. When the image sensor 100 is mounted on an autonomous vehicle, the image processor 70 may signal-process image data and transmit the signal-processed image data to a main controller that controls the autonomous vehicle.

Figure 2:
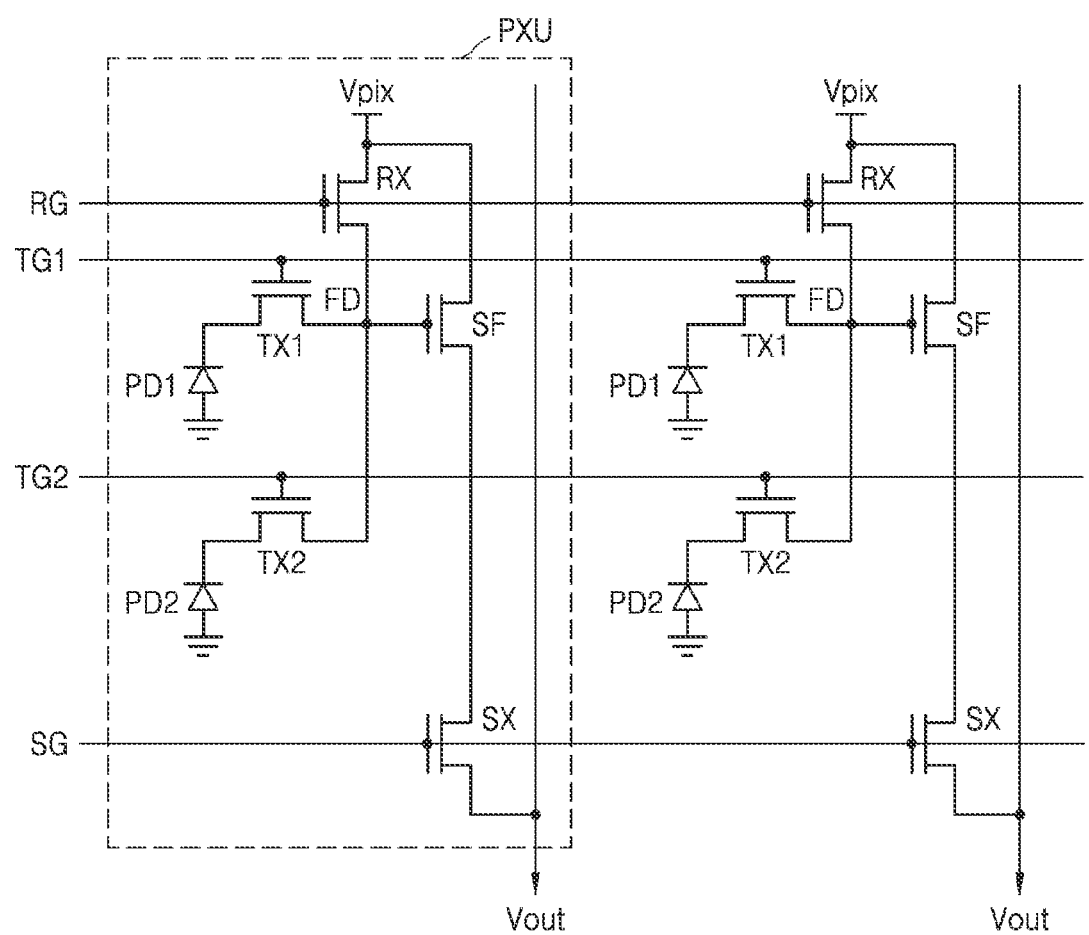
FIG. 2 is an example circuit diagram of a unit pixel included in an image sensor according to embodiments.

FIG. 2 is an example circuit diagram of the unit pixel PXU included in the image sensor 100 of FIG. 1, according to embodiments.

Referring to FIG. 2, each of the plurality of unit pixels PXU included in the pixel array 10 of the image sensor 100 shown in FIG. 1 may constitute a 2-shared pixel including two photodiodes, that is, first and second photodiodes PD1 and PD2.

In the unit pixel PXU, the first and second photodiodes PD1 and PD2 may share one floating diffusion region FD therebetween by using first and second transfer transistors TX1 and TX2. That is, the first transfer transistor TX1 corresponding to the first photodiode PD1 and the second transfer transistor TX2 corresponding to the second photodiode PD2 may share the one floating diffusion region FD as a common drain region therebetween.

In one unit pixel PXU, the first and second photodiodes PD1 and PD2 may share a reset transistor RX, a source follower transistor SF, and a selection transistor SX therebetween. Gate electrodes of the reset transistor RX, the first and second transfer transistors TX1, and TX2, and the selection transistor SX may be respectively connected to driving signal lines RG, TG1, TG2, and SG. The first and second photodiodes PD1 and PD2 may respectively constitute source regions of the first and second transfer transistors TX1 and TX2 corresponding respectively thereto. The floating diffusion region FD may constitute the common drain region of the first and second transfer transistors TX1 and TX2. The floating diffusion region FD may be connected to each of a source region of the reset transistor RX and a gate electrode of the source follower transistor SF. A drain region of the reset transistor RX and a drain region of the source follower transistor SF may be connected to a power supply voltage Vpix. A source region of the source follower transistor SF and a drain region of the selection transistor SX may be shared with each other. An output voltage Vout may be connected to a source region of the selection transistor SX.

The first and second photodiodes PD1 and PD2 may generate and accumulate charges in proportion to the amount of light incident from the outside. The gate electrodes of the first and second transfer transistors TX1 and TX2 may transfer the charges accumulated in the first and second photodiodes PD1 and PD2 to the floating diffusion region FD. Complementary signals may be respectively applied from the driving signal lines TG1 and TG2 to the gate electrodes of the first and second transfer transistors TX1 and TX2, and the charges may be transferred from any one of the first and second photodiodes PD1 and PD2 to the floating diffusion region FD. The floating diffusion region FD may receive and store the charges generated by the first and second photodiodes PD1 and PD2.

The floating diffusion region FD may be periodically reset by the reset transistor RX. When the reset transistor RX is turned on by a reset signal, the power supply voltage Vpix supplied to the reset transistor RX may be transferred to the floating diffusion region FD, and charges accumulated in the floating diffusion region FD may be emitted. Accordingly, the floating diffusion region FD may be reset.

The gate electrode of the source follower transistor SF may be connected to the floating diffusion region FD. The source follower transistor SF may serve as a source follower buffer amplifier and may amplify a change in electrical potential of the floating diffusion region FD. A pixel signal amplified by the source follower transistor SF may be output to an output line Vout through the selection transistor SX. The drain region of the source follower transistor SF may be connected to the power supply voltage Vpix, and the source region of the source follower transistor SF may be connected to the drain region of the selection transistor SX.

The selection transistor SX may select a unit pixel PXU to be read in units of rows. When the selection transistor SX is turned on, the power supply voltage Vpix connected to the drain region of the source follower transistor SF may be transferred to the drain region of the selection transistor SX.

Figure 3:
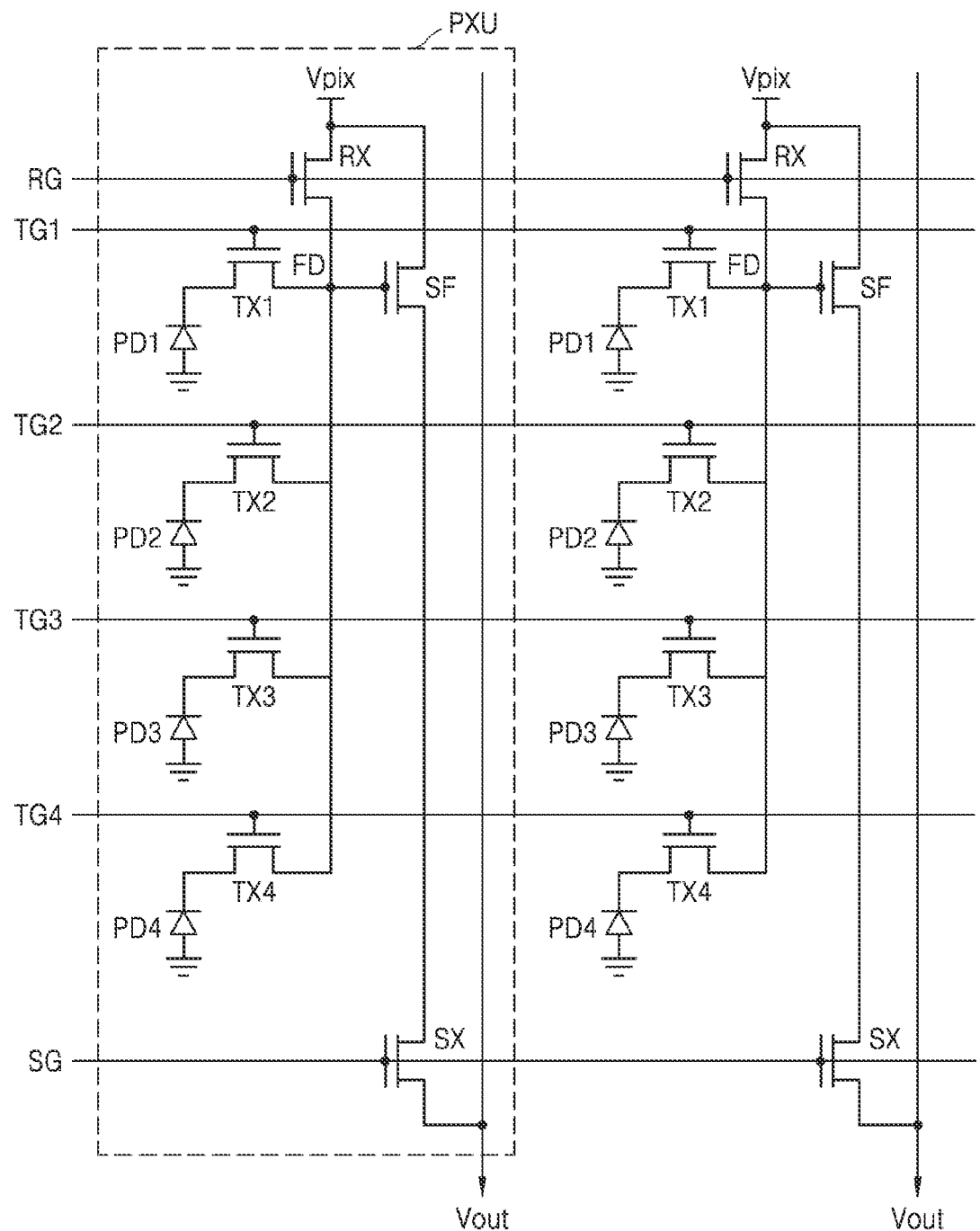
FIG. 3 is an example circuit diagram of a unit pixel included in an image sensor according to embodiments.

FIG. 3 is an example circuit diagram of the unit pixel PXU that may be included in the image sensor 100, according to embodiments.

Referring to FIG. 3, each of the plurality of unit pixels PXU included in the pixel array 10 of the image sensor 100 shown in FIG. 1 may constitute a 4-shared pixel including four photodiodes, that is, first to fourth photodiodes PD1, PD2, PD3, and PD4. In one unit pixel PXU, the first to fourth photodiodes PD1, PD2, PD3, and PD4 may share one floating diffusion region FD by using first to fourth transfer transistors TX1, TX2, TX3, and TX4. The first transfer transistor TX1 corresponding to the first photodiode PD1, the second transfer transistor TX2 corresponding to the second photodiode PD2, the third transfer transistor TX3 corresponding to the third photodiode PD3, and the fourth transfer transistor TX4 corresponding to the fourth photodiode PD4 may share the one floating diffusion region FD as a common drain region therebetween. In one unit pixel PXU, the first to fourth photodiodes PD1, PD2, PD3, and PD4 may share a reset transistor RX, a source follower transistor SF, and a selection transistor SX therebetween. In response to signals applied to the first to fourth transfer transistors TX1, TX2, TX3, and TX4 through driving signal lines TG1, TG2, TG3, and TG4, charges may be transferred from one of the first to fourth photodiodes PD1, PD2, PD3, and PD4 to the floating diffusion region FD.

The image sensor 100 according to embodiments may detect a reset voltage and a pixel voltage from each of the unit pixels PXU each having the circuit configuration illustrated in FIG. 2 or FIG. 3 and obtain a pixel signal by calculating a difference between the reset voltage and the pixel voltage. The pixel voltage may be a voltage reflecting electric charges generated by a photodiode included in each of the plurality of unit pixels PXU illustrated in FIG. 1.

Although FIGS. 2 and 3 illustrate examples in which the unit pixel PXU included in the image sensor 100 constitutes a 2-shared pixel or a 4-shared pixel, embodiments of the inventive concept are not limited thereto. For example, a unit pixel PXU according to an embodiment may constitute an N-shared pixel including N photodiodes (in which N is an integer of 2 or more). For example, each of the plurality of unit pixels PXU included in the image sensor 100 may include a 2-shared pixel including two photodiodes, a 4-shared pixel including four photodiodes, or an 8-shared pixel including eight photodiodes.

Figure 4:
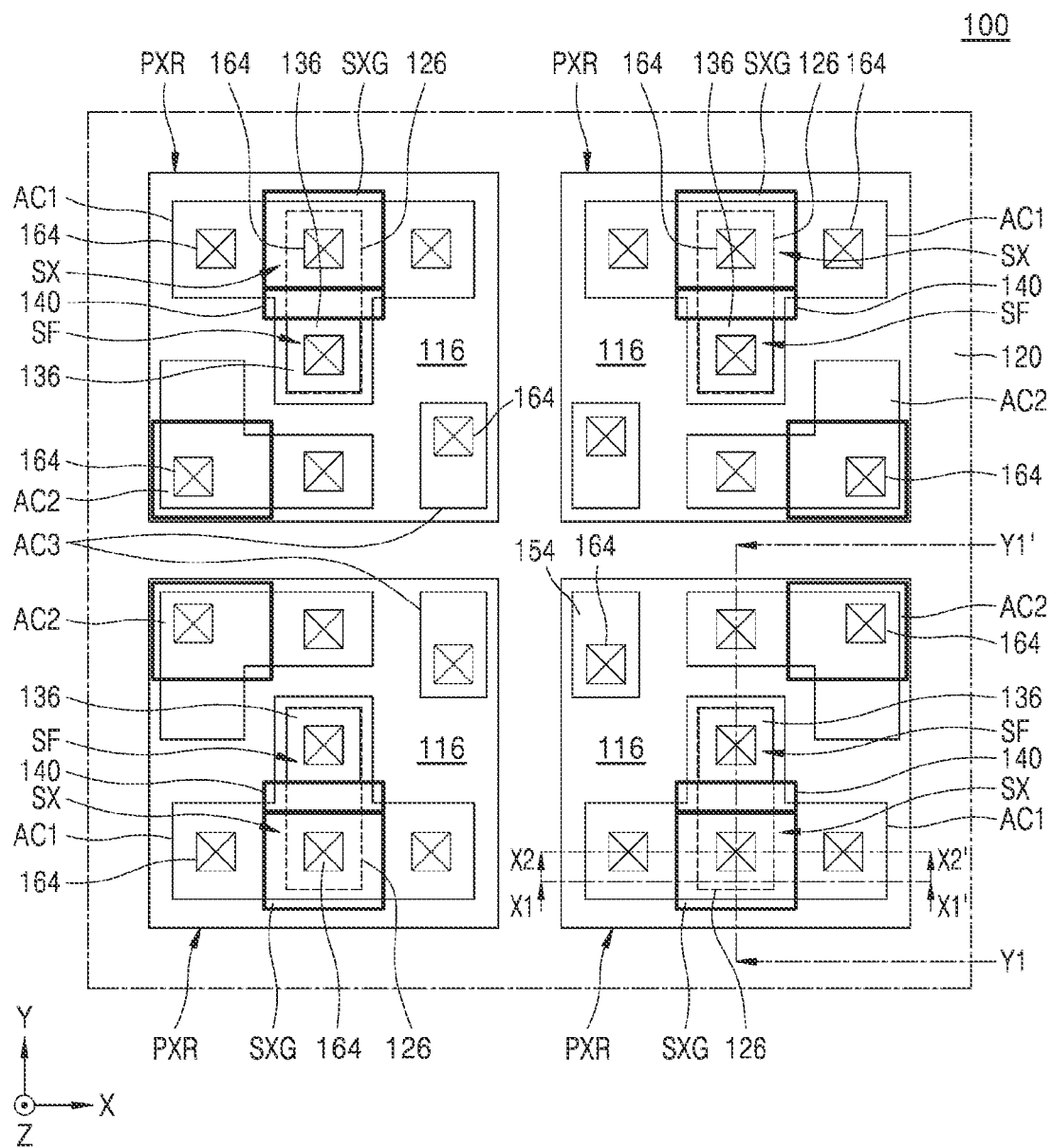
FIG. 4 is a plan layout illustrating an example structure of a unit pixel included in a pixel array of an image sensor according to embodiments.
Figure 5A:
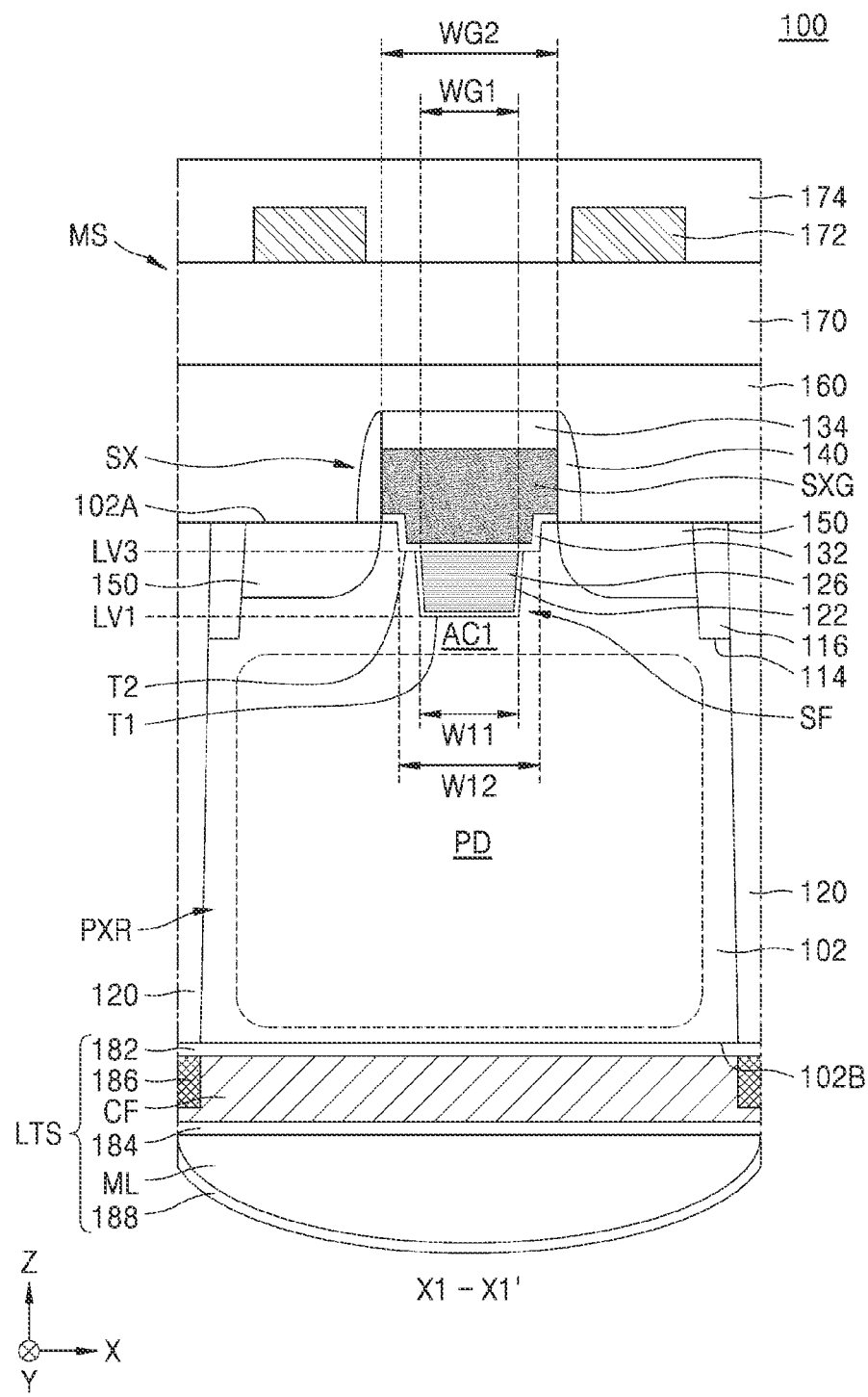
FIG. 5A is a cross-sectional view of an example configuration according to the cross-section taken along line X1-X1' of FIG. 4.
Figure 5B:
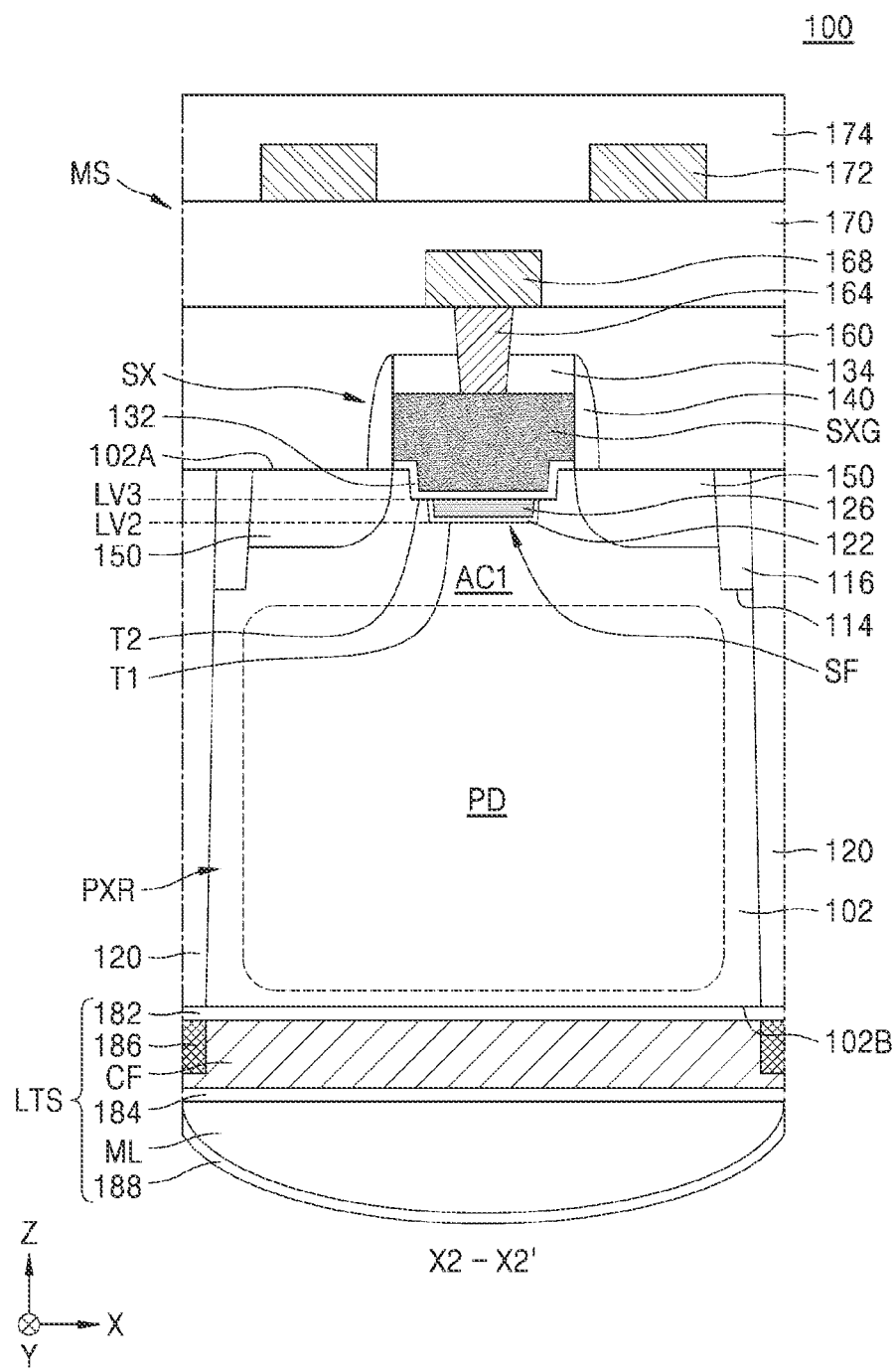
FIG. 5B is a cross-sectional view of an example configuration according to the cross-section taken along line X2-X2' of FIG. 4.
Figure 5C:
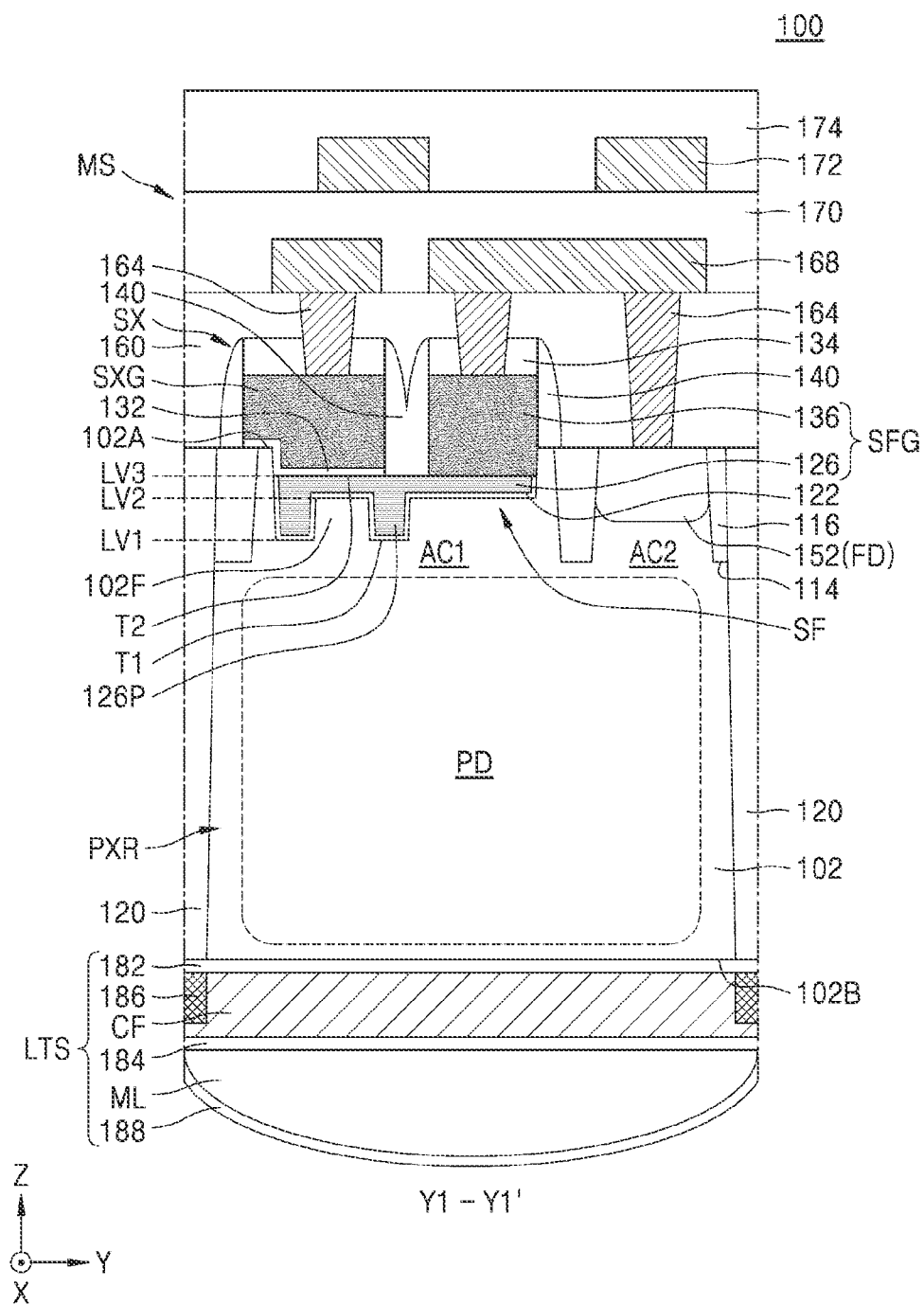
FIG. 5C is a cross-sectional view of an example configuration according to the cross-section taken along line Y1-Y1' of FIG. 4.

FIG. 4 is a plan layout illustrating an example structure of a plurality of unit pixels PXU included in an image sensor 100 according to embodiments. FIG. 5A is a cross-sectional view of an example configuration according to the cross-section taken along line X1-X1' of FIG. 4. FIG. 5B is a cross-sectional view of an example configuration according to the cross-section taken along line X2-X2' of FIG. 4. FIG. 5C is a cross-sectional view of an example configuration according to the cross-section taken along line Y1-Y1' of FIG. 4. For convenience of illustration, some components of the plurality of unit pixels PXU included in the image sensor 100 shown in FIG. 1 are illustrated in FIGS. 4 and 5A to 5C, and some components are omitted.

Referring to FIGS. 4 and 5A to 5C, the image sensor 100 may include a substrate 102 including a plurality of pixel areas PXR. In the substrate 102, the plurality of pixel areas PXR may be defined by a pixel isolation insulating film 120. Each of the plurality of pixel areas PXR may include a photodiode PD formed in the substrate 102. The plurality of pixel areas PXR may be areas configured to sense light incident from outside the image sensor. In example embodiments, the photodiode PD may be any one of the first and second photodiodes PD1 and PD2 shown in FIG. 2 or any one of the first to fourth photodiodes PD1, PD2, PD3, and PD4 shown in FIG. 3.

The substrate 102 may include a semiconductor layer. In example embodiments, the substrate 102 may include a semiconductor layer doped with P-type impurities. For example, the substrate 102 may include a semiconductor layer including silicon (Si), germanium (Ge), silicon germanium (SiGe), a group II-VI compound semiconductor, a group III-V compound semiconductor, or a combination thereof, or a silicon on insulator (SOI) substrate. In example embodiments, the substrate 102 may include a P-type epitaxial semiconductor layer epitaxially grown from a P-type bulk silicon substrate. The substrate 102 may have a front side surface 102A and a back side surface 102B that are opposite surfaces.

The pixel isolation insulating film 120 may have a planar structure surrounding the photodiode PD. The pixel isolation insulating film 120 may extend long from the front side surface 102A of the substrate 102 to the back side surface 102B of the substrate 102 in a thickness direction of the substrate 102. In example embodiments, the pixel isolation insulating film 120 may include silicon oxide, silicon nitride, silicon carbonitride (SiCN), silicon oxynitride (SiON), silicon oxycarbide (SiOC), polysilicon, a metal, a metal nitride, a metal oxide, borosilicate glass (BSG), phosphosilicate glass (PSG), borophosphosilicate glass (BPSG), plasma enhanced tetraethyl orthosilicate (PE-TEOS), fluoride silicate glass (FSG), carbon doped silicon oxide (CDO), organosilicate glass (OSG), air, or a combination thereof. Herein, the term "air" may refer to other gases that may be in the atmosphere or during a manufacturing process. For example, tungsten (W), copper (Cu), or a combination thereof may be provided as a metal that may be included in the pixel isolation insulating film 120. A metal nitride that may be included in the pixel isolation insulating film 120 may include, for example, titanium nitride (TiN), tantalum nitride (TaN), or a combination thereof. A metal oxide that may be included in the pixel isolation insulating film 120 may include, for example, indium tin oxide (ITO), aluminum oxide ($Al_2O_3$), or a combination thereof.

In each of the pixel areas PXR, a plurality of active areas (e.g., first to third active areas AC1, AC2, and AC3) may be defined by a device isolation trench 114. The device isolation trench 114 may be filled with a device isolation insulating film 116. The device isolation insulating film 116 may include, for example, a silicon oxide film, a silicon nitride film, or a combination thereof.

A plurality of transistors and a wiring structure MS may be on the front side surface 102A of the substrate 102. In example embodiments, the plurality of transistors may include the first and second transfer transistors TX1 and TX2, the reset transistor RX, the source follower transistor SF, and the selection transistor SX, which are described above with reference to FIG. 2. In example embodiments, the plurality of transistors may include the first to fourth transfer transistors TX1, TX2, TX3, and TX4, the reset transistor RX, the source follower transistor SF, and the selection transistor SX, which are described with reference to FIG. 3. Each of the plurality of unit pixels PXU may include a source follower transistor SF, a selection transistor SX, and a transfer transistor TX.

In the plurality of unit pixels PXU, the plurality of active areas (e.g., the first to third active areas AC1, AC2, and AC3) may be defined in the substrate 102. A first trench T1 and a second trench T2, which may interface with each other, may be formed in the first active area AC1, which is selected from the first to third active areas AC1, AC2, and AC3. The first active area AC1 of the substrate 102 may include a fin region 102F, which protrudes upward from the substrate 102 in a vertical direction (Z direction). A bottom surface of the first trench T1 may have a rough shape to define the fin region 102F of the substrate 102, and a width of the fin region 102F in a second lateral direction (Y direction) may be defined by the bottom surface of the first trench T1.

A lowermost portion of the bottom surface of the first trench T1 may be at a first level LV1, which is spaced a first vertical distance apart from the front side surface 102A of the substrate 102 toward the inside of the substrate 102. A portion of the bottom surface of the first trench T1, which is in contact with a top surface of the fin region 102F, may be at a second level LV2, which is spaced a second vertical distance apart from the front side surface 102A of the substrate 102 toward the inside of the substrate 102. The second vertical distance may be less than the first vertical distance. The second trench T2 may be closer to the front side surface 102A of the substrate 102 than the first trench T1. A lowermost portion of the second trench T2 may be at a third level LV3, which is higher than the second level LV2 and lower than a level of the front side surface 102A of the substrate 102. In a first lateral direction (X direction), a width W11 of the first trench T1 may be less than a width W12 of the second trench T2.

The source follower transistor SF may be formed in the first active area AC1. The source follower transistor SF may include a gate dielectric film 122, which is buried in the substrate 102 in the first active area AC1, and a gate electrode SFG formed on the gate dielectric film 122. The gate dielectric film 122 of the source follower transistor SF may conformally cover an inner surface of the first trench T1. The gate electrode SFG of the source follower transistor SF may include a buried gate portion 126 and an upper gate portion 136. The buried gate portion 126 may be buried in the substrate 102 in the first active area AC1. The upper gate portion 136 may protrude upward from a top surface of the buried gate portion 126 to a level higher than a level of the front side surface 102A of the substrate 102 in the vertical direction (Z direction). The buried gate portion 126 of the source follower transistor SF may fill the first trench T1 on the gate dielectric film 122. The gate dielectric film 122 may be between the first active area AC1 and the buried gate portion 126. The top surface of the buried gate portion 126 may extend in a lateral direction at the third level LV3 between the level of the front side surface 102A of the substrate 102 and the second level LV2. A portion of the upper gate portion 136 of the source follower transistor SF may be buried in the substrate 102 and fill a portion of the second trench T2. A bottom surface of the upper gate portion 136 may be in contact with the top surface of the buried gate portion 126 at a level lower than the level of the front side surface 102A of the substrate 102. The buried gate portion 126 and the upper gate portion 136 of the source follower transistor SF may overlap the photodiode PD in the vertical direction (Z direction).

The selection transistor SX may include a gate dielectric film 132 and a gate electrode SXG, which are sequentially stacked on the first active area AC1. The gate electrode SXG of the selection transistor SX may overlap the buried gate portion 126 of the source follower transistor SF in the vertical direction (Z direction). A lowermost surface of the gate electrode SXG of the selection transistor SX may be at a lower level than a level of the front side surface 102A of the substrate 102 and face the buried gate portion 126 of the source follower transistor SF with the gate dielectric film 132 therebetween. The gate electrode SXG of the selection transistor SX may include a portion, which is buried in the substrate 102 to partially fill the second trench T2, and a portion, which protrudes upward to a level higher than the level of the front side surface 102A of the substrate 102 in the vertical direction (Z direction).

A pair of impurity regions 150 may be formed in the first active area AC1. The pair of impurity regions 150 may be apart from each other in the first lateral direction (X direction) with the gate electrode SXG of the selection transistor SX and the gate electrode SFG of the source follower transistor SF therebetween. The pair of impurity regions 150 may respectively operate as a source and a drain of each of the selection transistor SX and the source follower transistor SF.

Of the gate electrode SFG of the source follower transistor SF, the upper gate portion 136 may be apart from the gate electrode SXG of the selection transistor SX in the second lateral direction (Y direction) that is perpendicular to the first lateral direction (X direction). In the second lateral direction (Y direction), the upper gate portion 136 of the source follower transistor SF may face the gate electrode SXG of the selection transistor SX. The gate electrode SFG of the source follower transistor SF and the gate electrode SXG of the selection transistor SX may overlap the photodiode PD in the vertical direction (Z direction).

In example embodiments, each of the gate electrode SFG of the source follower transistor SF and the gate electrode SXG of the selection transistor SX may include doped polysilicon. For example, each of the gate electrode SFG and the gate electrode SXG may include polysilicon doped with N-type impurities, such as phosphorus (P) or arsenic (As). In example embodiments, each of a first dopant concentration of the gate electrode SXG and a second dopant concentration of the upper gate portion 136 of the gate electrode SFG may be higher than a third dopant concentration of the buried gate portion 126 of the gate electrode SFG. The first and second dopant concentrations may be about equal or similar to each other. For example, each of the first to third dopant concentrations may be selected in a range of about $1\times10^{11}/cm^3$ to about $1\times10^{15}/$ cm³, and each of the first and second dopant concentrations may be about 1.1 to about 1.3 times greater than the third dopant concentration.

The gate dielectric film 122 of the source follower transistor SF may be between the first active area AC1 and the buried gate portion 126. The gate dielectric film 132 of the selection transistor SX may include a portion between the first active area AC1 and the gate electrode SXG and a portion between the gate electrode SXG and the gate electrode SFG of the source follower transistor SF. The gate electrode SXG of the selection transistor SX may be apart from the buried gate portion 126 of the source follower transistor SF in the vertical direction (Z direction) with the gate dielectric film 132 therebetween.

Each of the gate dielectric film 122 of the source follower transistor SF and the gate dielectric film 132 of the selection transistor SX may include a silicon oxide film, without being limited thereto.

A thickness of the gate dielectric film 132 of the selection transistor SX may be greater than a thickness of the gate dielectric film 122 of the source follower transistor SF. For example, the thickness of the gate dielectric film 132 of the selection transistor SX may be about 1.1 to about 2.5 times the thickness of the source follower transistor SF, without being limited thereto.

As shown in FIG. 5A, a width WG1 of the buried gate portion 126 of the source follower transistor SF may be less than a width WG2 of the gate electrode SXG of the selection transistor SX in the first lateral direction (X direction).

As shown in FIG. 5C, the fin region 102F formed in the first active area AC1 may protrude upward in the vertical direction (Z direction) toward the buried gate portion 126, which constitutes the gate electrode SFG of the source follower transistor SF. The buried gate portion 126 may include a protrusion 126P, which protrudes in a direction away from the front side surface of the substrate 102 toward the inside of the substrate 102 in the vertical direction (Z direction). The protrusion 126P included in the buried gate portion 126 of the source follower transistor SF may cover a sidewall of the fin region 102F. Sidewalls and the top surface of the fin region 102F may be surrounded by the buried gate portion 126 of the source follower transistor SF with the gate dielectric film 122 therebetween. A channel length of the source follower transistor SF may be increased due to the fin region 102F formed in the first active area AC1. Accordingly, even when the image sensor 100 becomes highly integrated and the size of the pixel area PXR is miniaturized, issues caused by a short channel effect (SCE) of the source follower transistor SF may be prevented. Also, even though noise is generated by randomly trapping or de-trapping charges in the gate dielectric film 122 due to the occurrence of current fluctuation in a channel of the source follower transistor SF, the deterioration of characteristics due to the noise may be prevented. In addition, pixel response characteristics may be prevented from deteriorating by maintaining linearity between a low-illuminance signal and a high-illuminance signal during signal synthesis.

The selection transistor SX may overlap the buried gate portion 126 of the source follower transistor SF in the vertical direction (Z direction) in the first active area AC1. The selection transistor SX may have a dual-gate-type transistor structure in which channels are respectively formed on both sides of the buried gate portion 126 in the first lateral direction (X direction). Accordingly, the amount of current flowing through the selection transistor SX may be increased. Therefore, even when the selection transistor SX is downscaled, issues caused by a leakage current may be prevented, and thus, the performance of the selection transistor SX may not be degraded.

A top surface of the upper gate portion 136 of the source follower transistor SF and a top surface of the gate electrode SXG of the selection transistor SX may be covered by a plurality of insulating capping patterns 134. Sidewalls of the upper gate portion 136 of the source follower transistor SF, sidewalls of the gate electrode SXG of the selection transistor SX, and sidewalls of the plurality of insulating capping patterns 134 may be covered by a plurality of insulating spacers 140. In the second lateral direction (Y direction), a space between the upper gate portion 136 of the source follower transistor SF and the gate electrode SXG of the selection transistor SX may be filled with the insulating spacer 140. A portion of the insulating spacer 140, that is, only a portion of the insulating spacer 140 between the upper gate portion 136 of the source follower transistor SF and the gate electrode SXG of the selection transistor SX, is illustrated in FIG. 4 for convenience of illustration. The plurality of insulating capping patterns 134 and the plurality of insulating spacers 140 may each include, for example, a silicon oxide film, a silicon nitride film, a silicon oxynitride film, or a combination thereof.

A contact plug 164 may be connected to each of the top surface of the upper gate portion 136 of the source follower transistor SF and the top surface of the gate electrode SXG of the selection transistor SX.

The transfer transistor TX may be in the second active area AC2, from among the first to third active areas AC1, AC2, and AC3. The transfer transistor TX may include a gate electrode TXG. A portion of the gate electrode TXG may be buried in the substrate 102, and a recess channel may be formed in the transfer transistor TX along a recess surface of the second active area AC2 surrounding the portion of the gate electrode TXG, which is buried in the substrate 102.

As shown in FIG. 5C, an impurity region 152 may be formed on one side of the transfer transistor TX in the second active area AC2. The impurity region 152 may be a floating diffusion region FD. The contact plug 164 may be connected to the impurity region 152. The transfer transistor TX may constitute any one of the first and second transfer transistors TX1 and TX2, which are described with reference to FIG. 2, or any one of the first to fourth transfer transistors TX1, TX2, TX3, and TX4, which are described with reference to FIG. 3.

An impurity region (refer to 154 in FIG. 4) may be formed in the third active area AC3, from among the first to third active areas AC1, AC2, and AC3, and the contact plug 164 may be connected to the impurity region 154. The impurity region 154 may be a ground region, and the contact plug 164 connected to the impurity region 154 may be a ground contact plug. A plurality of impurity regions 150, 152, and 154 formed in the first to third active areas AC1, AC2, and AC3 may be N-type impurity regions.

The plurality of transistors including the source follower transistor SF, the selection transistor SX, and the transfer transistor TX, which are on the front side surface 102A of the substrate 102, may be covered by an interlayer insulating film 160.

An electric signal converted by the photodiode PD may be signal-processed by the plurality of transistors and a wiring structure MS, which are on the front side surface 102A of the substrate 102. The wiring structure MS may include a plurality of contact plugs 164, which are selectively connected to the plurality of transistors including the source follower transistor SF, the selection transistor SX, and the transfer transistor TX, a plurality of conductive lines 168 and 172, which are selectively connected to the plurality of transistors through the contact plugs 164, and a plurality of interlayer insulating films 170 and 174 covering the plurality of conductive lines 168 and 172. In example embodiments, the upper gate portion 136 of the gate electrode SFG of the source follower transistor SF, and the floating diffusion region FD may be electrically connected to each other through the plurality of contact plugs 164 and the conductive line 168.

The plurality of contact plugs 164 and the plurality of conductive lines 168 and 172 may each include a metal, a conductive metal nitride, or a combination thereof. For instance, the plurality of contact plugs 164 and the plurality conductive lines 168 and 172 may each include copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or a combination thereof, without being limited thereto. The plurality of interlayer insulating films 160, 170, and 174 may each include, for example, an oxide film, a nitride film, or a combination thereof.

The number and arrangement of the interlayer insulating films 160, 170, and 174 and the number and arrangement of the plurality of conductive lines 168 and 172 are not limited to those illustrated in FIGS. 5A to 5C, and various changes and modifications may be made according to embodiments. The plurality of conductive lines 168 and 172 in the wiring structure MS may include wirings connected to a plurality of transistors electrically connected to the photodiode PD formed in the pixel area PXR. The plurality of transistors may include the first and second transfer transistors TX1 and TX2, the reset transistor RX, the source follower transistor SF, and the selection transistor SX, which are described with reference to FIG. 2, or include the first to fourth transfer transistors TX1, TX2, TX3, and TX4, the reset transistor RX, the source follower transistor SF, and the selection transistor SX, which are described with reference to FIG. 3. In example embodiments, the reset transistor RX may be arranged in a row direction or a column direction around the plurality of pixel areas PXR. Electrical signals converted by the photodiode PD may be signal-processed by the wiring structure MS. The arrangement of the plurality of conductive lines 168 and 172 may be freely changed irrespective of the arrangement of the photodiode PD.

A light-transmitting structure LTS may be arranged on the back side surface 102B of the substrate 102. The light-transmitting structure LTS may include a first planarization film 182, a color filter CF, a second planarization film 184, a microlens ML, and a protective capping film 188 sequentially stacked on the back side surface 102B. The microlens ML may be protected by the protective capping film 188. The light-transmitting structure LTS may condense and filter light incident from outside and provide the condensed and filtered light to the pixel area PXR. The photodiode PD in one pixel area PXR may be covered by one microlens ML. The microlens ML may have an outwardly convex shape to condense light incident on the photodiode PD. The unit pixel PXU may have a back side illumination (BSI) structure that receives light from the back side surface 102B of the substrate 102.

In the light-transmitting structure LTS, the first planarization film 182 may be used as a buffer film that may prevent or reduce damage to the substrate 102 during a process of manufacturing the image sensor 100. The first planarization film 182 and the second planarization film 184 may each include, for example, a silicon oxide film, a silicon nitride film, a resin, or a combination thereof, but are not limited thereto.

In example embodiments, the color filter CF may include a red color filter, a green color filter, a blue color filter, or a white color filter. The white color filter may be a transparent color filter that transmits light in a visible wavelength band. The pixel array 10 illustrated in FIG. 1 may include a plurality of color filter groups in which a red color filter, a green color filter, a blue color filter, and a white color filter are arranged in a two-dimensional array of 2×2 to form one color filter group. The plurality of color filter groups may be arranged in a matrix form along a plurality of rows and a plurality of columns. In example embodiments, the color filter CF may have another color such as, for example, cyan, magenta, or yellow.

The light-transmitting structure LTS may further include an anti-reflection film 186 formed on the first planarization film 182. The anti-reflection film 186 may be arranged at a position overlapping the pixel isolation insulating film 120 defining the pixel area PXR in a vertical direction (Z direction) on an edge portion of the pixel area PXR. The top surface and sidewalls of the anti-reflection film 186 may be covered by a color filter CF. The anti-reflection film 186 may prevent incident light passing through the color filter CF from being laterally reflected or scattered. For example, the anti-reflection film 186 may prevent photons reflected or scattered at the interface between the color filter CF and the first planarization film 182 from moving to another pixel area. The anti-reflection film 186 may include a metal. For example, the anti-reflection film 186 may include tungsten (W), aluminum (Al), copper (Cu), or a combination thereof.

Although partial regions of the plurality of unit pixels PXU are illustrated in FIGS. 4 and 5A to 5C, in an embodiment, the substrate 102 of the image sensor 100 may include an area including the plurality of unit pixels PXU described with reference to FIG. 1, a peripheral circuit area arranged around the plurality of unit pixels PXU, and a pad area (not shown). The peripheral circuit area may be an area including various types of circuits configured to control the plurality of unit pixels PXU. For example, the peripheral circuit area may include a plurality of transistors, which may be driven to provide a constant signal to the photodiode PD formed in the pixel area PXR or control an output signal from the photodiode PD. For example, the plurality of transistors may constitute various types of logic circuits such as a timing generator, a row decoder, a row driver, a CDS, an ADC, a latch, and a column decoder. The pad area may include conductive pads electrically connected to the plurality of unit pixels PXU and the circuits in the peripheral circuit area. The conductive pads may function as connection terminals configured to supply power and signals to the plurality of unit pixels PXU and the circuits in the peripheral circuit area from the outside.

Figure 6A:
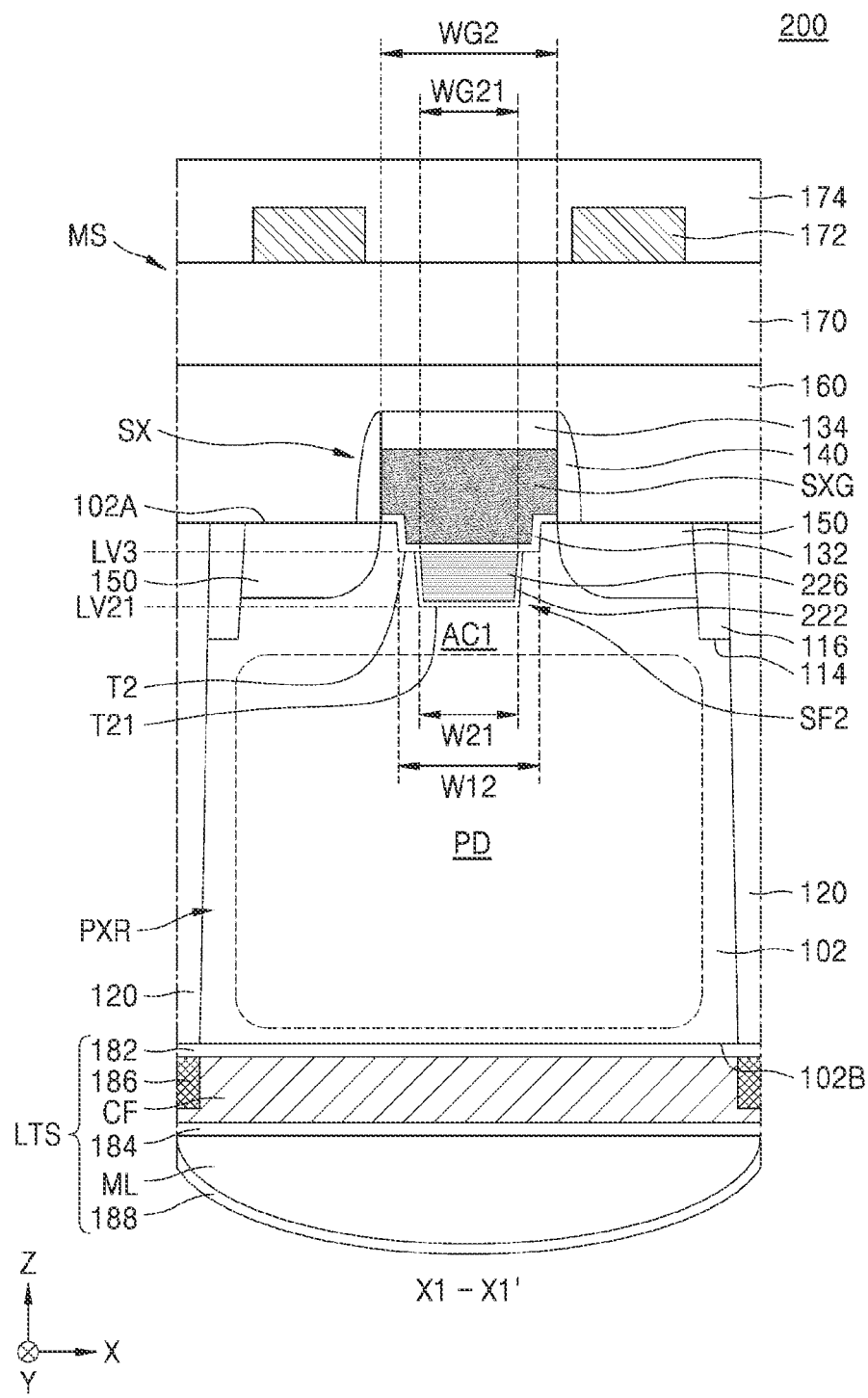
FIGS. 6A to 6C are cross-sectional views illustrating an image sensor according to embodiments.
Figure 6B:
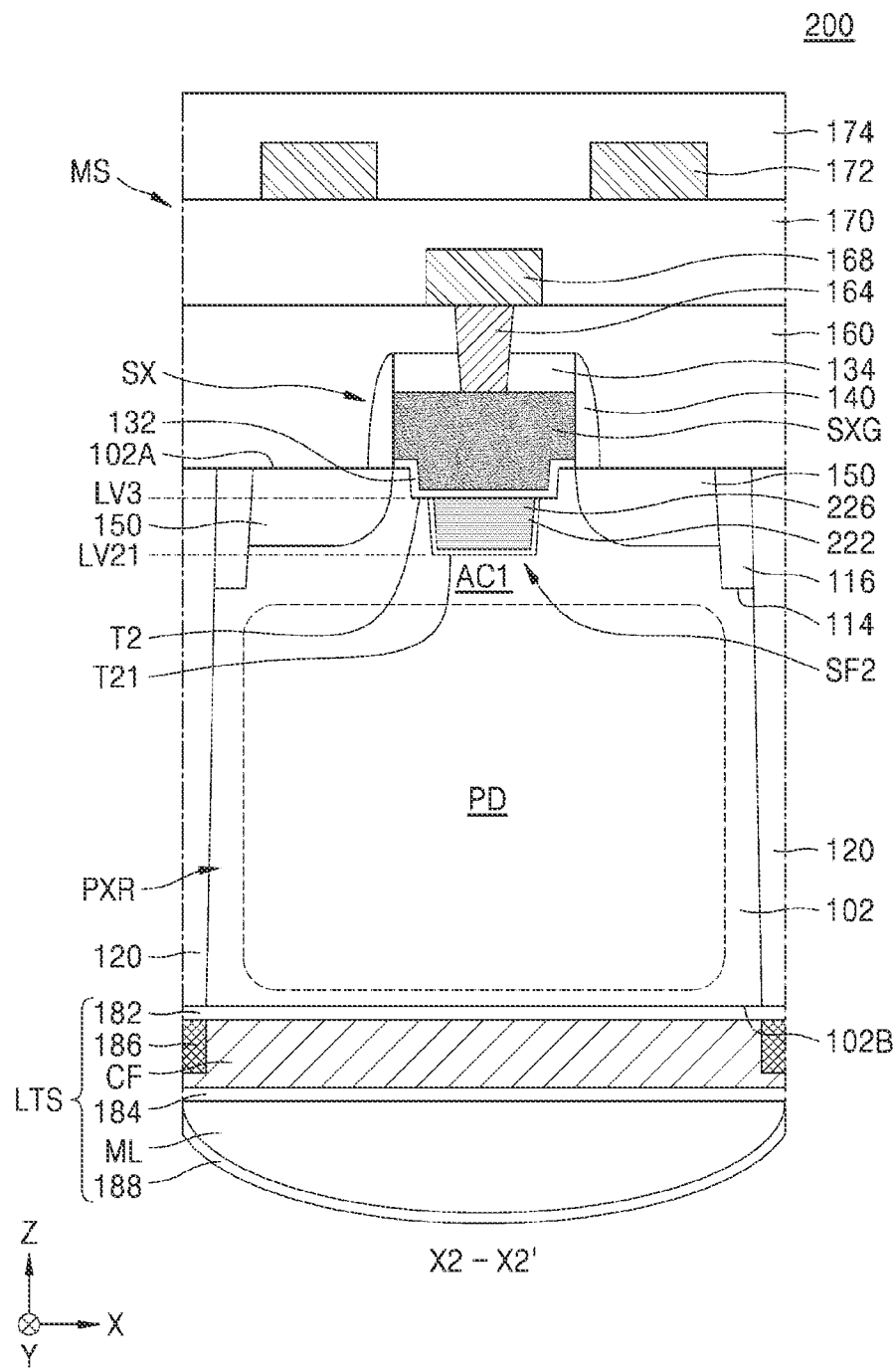
Figure 6C:
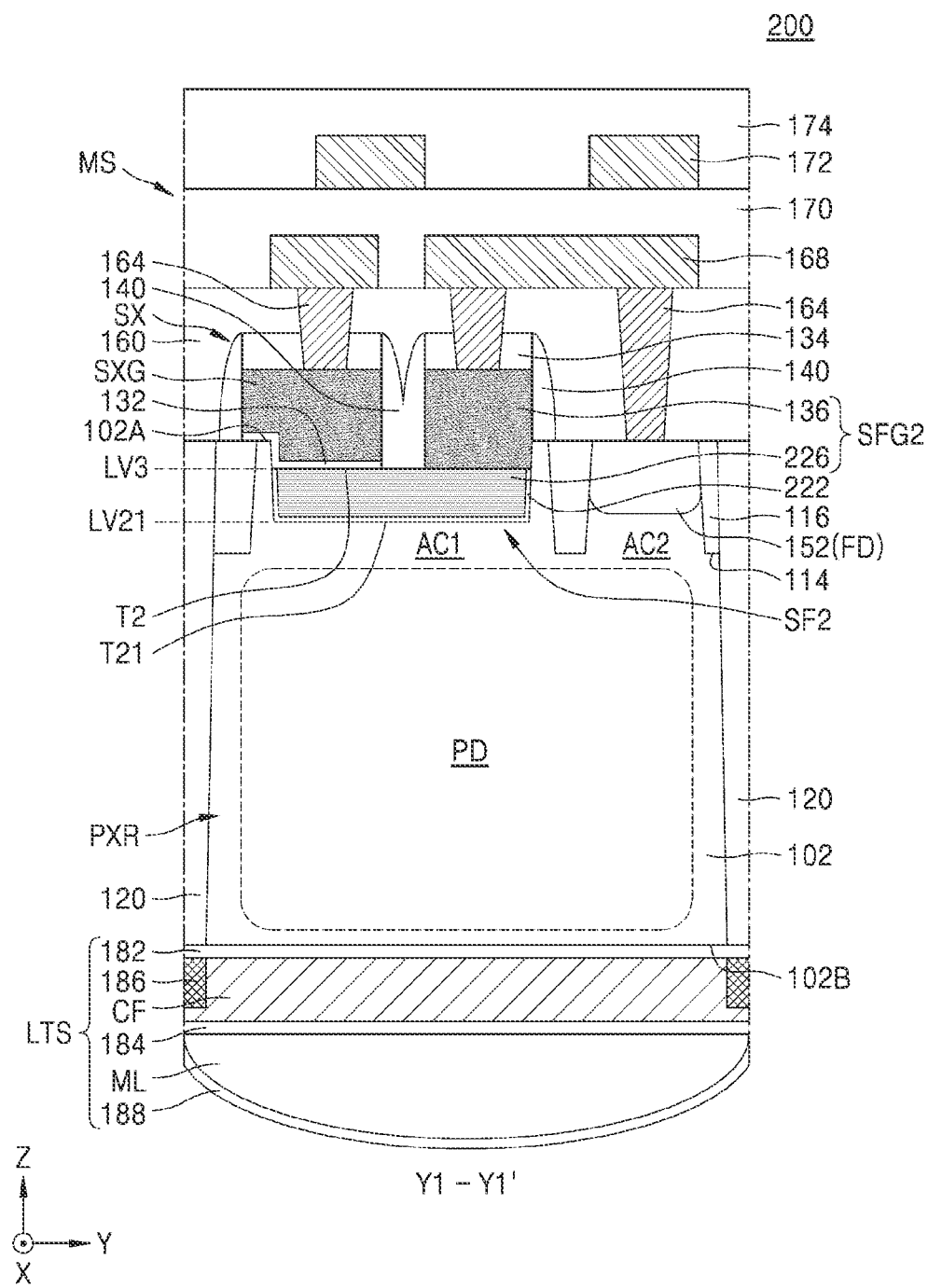

FIGS. 6A to 6C are diagrams illustrating an image sensor 200 according to embodiments. FIG. 6A is a cross-sectional view of an example configuration of a region of the image sensor 200 corresponding to the cross-section taken along line X1-X1' of FIG. 4. FIG. 6B is a cross-sectional view of an example configuration of a region of the image sensor 200 corresponding to the cross-section taken along line X2-X2' of FIG. 4. FIG. 6C is a cross-sectional view of an example configuration of a region of the image sensor 200 corresponding to the cross-section taken along line Y1-Y1' of FIG. 4. For convenience of explanation, in describing FIGS. 6A to 6C, a further description of components and technical aspects previously described with reference to FIGS. 1 to 5C may be omitted.

Referring to FIGS. 6A to 6C, the image sensor 200 has substantially the same configuration as the image sensor 100 described with reference to FIGS. 1 to 5C. However, in the image sensor 200, a source follower transistor SF2 may include a gate dielectric film 222, which is buried in a substrate 102 in a first active area AC1, and a gate electrode SFG2 formed on the gate dielectric film 222. The gate dielectric film 222 of the source follower transistor SF2 may conformally cover an inner surface of a first trench T21. The gate electrode SFG2 of the source follower transistor SF2 may include a buried gate portion 226, which is buried in the substrate 102 in the first active area AC1, and an upper gate portion 136, which is in contact with a top surface of the buried gate portion 226.

The first trench T21, the gate dielectric film 222, and the buried gate portion 226 may have substantially the same configurations as the first trench T1, the gate dielectric film 122, and the buried gate portion 126, which are described with reference to FIGS. 5A to 5C. However, a bottom surface of each the first trench T21, the gate dielectric film 222, and the buried gate portion 226 may extend substantially planarly in a lateral direction. The bottom surface of the first trench T21 may extend substantially planarly at a first level LV21 at a position apart from a front side surface 102A of the substrate 102. In an embodiment, the first active area AC1 does not include a fin region (refer to 102F in FIG. 5C).

In a first lateral direction (X direction), a width W21 of the first trench T21 may be less than a width W12 of a second trench T2. In the first lateral direction (X direction), a width WG21 of the buried gate portion 226 of the source follower transistor SF2 may be less than a width WG2 of a gate electrode SXG of a selection transistor SX.

Figure 7:
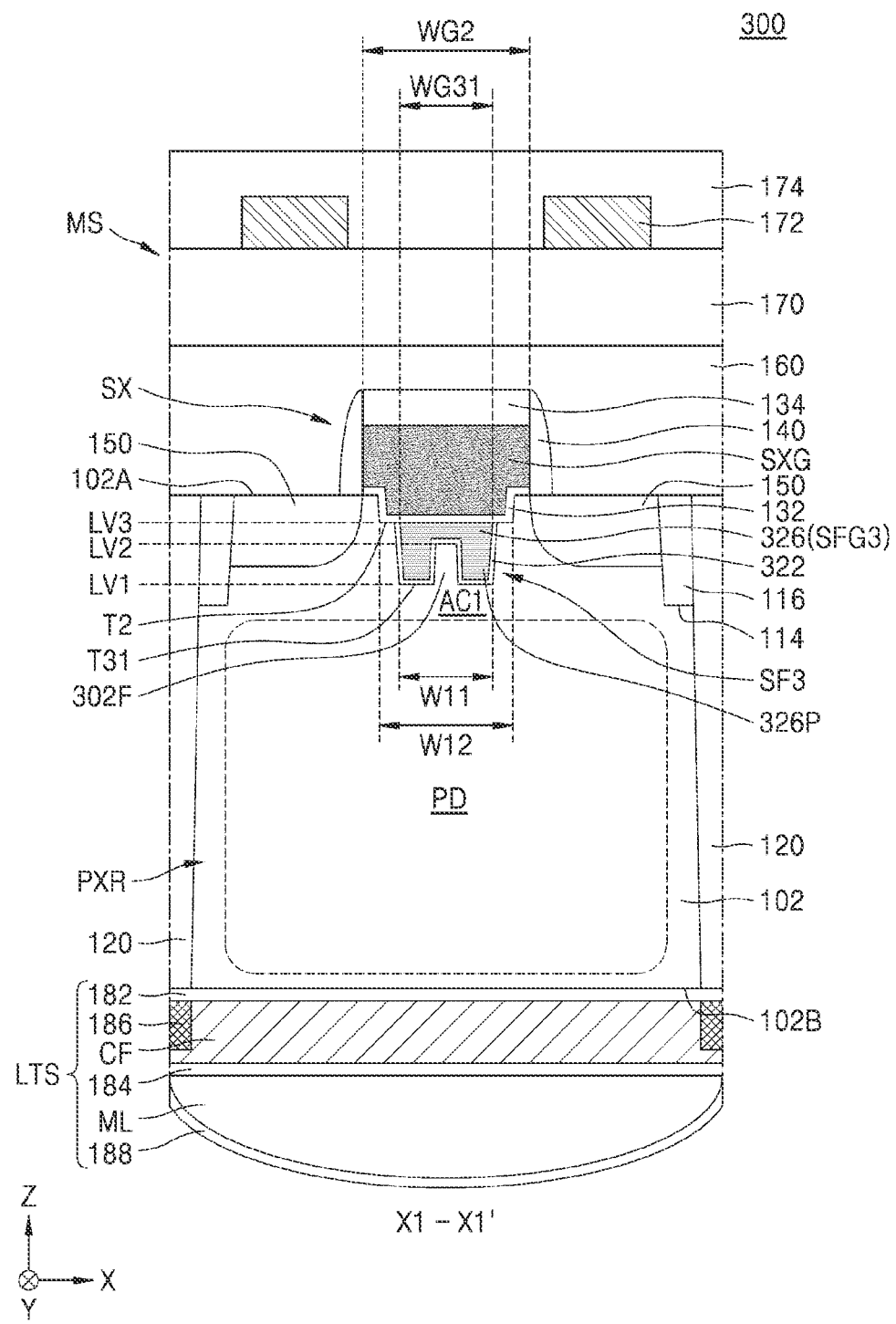
FIG. 7 is a cross-sectional view illustrating an image sensor according to embodiments.

FIG. 7 is a cross-sectional view of an image sensor 300 according to embodiments. FIG. 7 illustrates a cross-sectional configuration of a region of the image sensor 300 corresponding to the cross-section taken along line X1-X1' of FIG. 4. For convenience of explanation, in describing FIG. 7, a further description of components and technical aspects previously described with reference to FIGS. 1 to 5C may be omitted.

Referring to FIG. 7, the image sensor 300 has substantially the same configuration as the image sensor 100 described with reference to FIGS. 1 to 5C. However, in the image sensor 300, a source follower transistor SF3 may include a gate dielectric film 322, which is buried in a substrate 102 in a first active area AC1, and a gate electrode SFG3 formed on the gate dielectric film 322. The gate dielectric film 322 of the source follower transistor SF3 may conformally cover an inner surface of a first trench T31. The gate electrode SFG3 of the source follower transistor SF3 may include a buried gate portion 326, which is buried in the substrate 102 in the first active area AC1, and an upper gate portion (refer to 136 in FIG. 5C) in contact with a top surface of the buried gate portion 326.

The first active area AC1 may include a fin region 302F, which protrudes upward in a vertical direction (Z direction) toward the gate electrode SFG3 of the source follower transistor SF3. A width of the fin region 302F in a lateral direction may be defined by the first trench T31. The buried gate portion 326 of the source follower transistor SF3 may include a protrusion 326P, which protrudes in a direction away from the front side surface 102A of the substrate 102 toward the inside of the substrate 102 in the vertical direction (Z direction). The protrusion 326P may cover both sidewalls of the fin region 302F in a first lateral direction (X direction). The sidewalls and a top surface of the fin region 302F may be surrounded by the buried gate portion 326 of the source follower transistor SF3 with the gate dielectric film 322 therebetween. A channel length of the source follower transistor SF3 may be increased due to the fin region 302F. Accordingly, even when the image sensor 300 becomes highly integrated and the size of the pixel area PXR is miniaturized, issues caused by an SCE of the source follower transistor SF3 may be prevented, and the deterioration of characteristics due to noise may be prevented in a channel of the source follower transistor SF3. In addition, pixel response characteristics may be prevented from deteriorating by maintaining linearity between a low-illuminance signal and a high-illuminance signal during signal synthesis.

A width WG31 of the buried gate portion 326 of the source follower transistor SF3 may be less than a width WG2 of a gate electrode SXG of a selection transistor SX in the first lateral direction (X direction). Detailed configurations of the first trench T31, the gate dielectric film 322, and the buried gate portion 326 may be substantially the same as those of the first trench T1, the gate dielectric film 122, and the buried gate portion 126, which are described with reference to FIGS. 5A to 5C.

Figure 8:
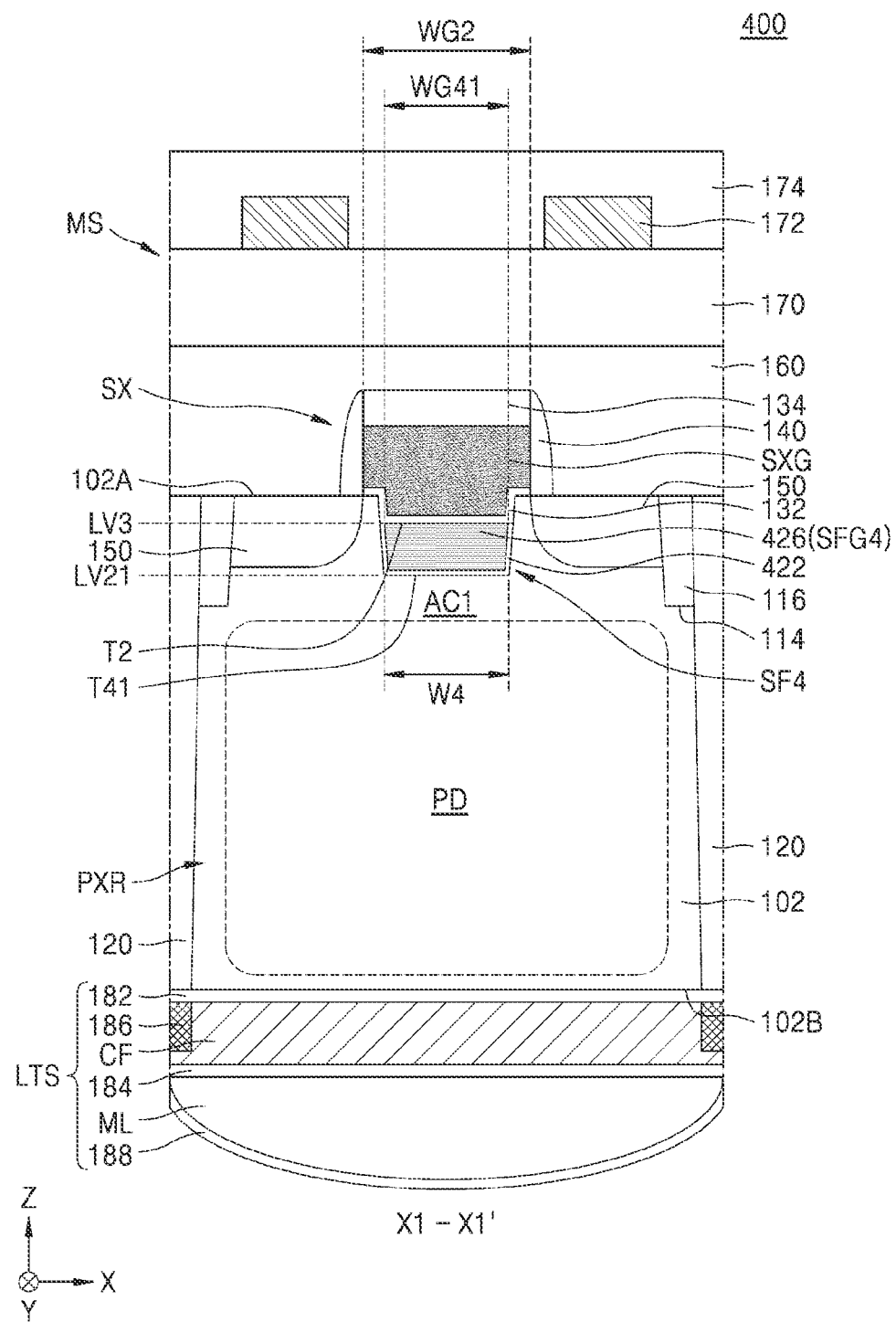
FIG. 8 is a cross-sectional view illustrating an image sensor according to embodiments.

FIG. 8 is a cross-sectional view of an image sensor 400 according to embodiments. FIG. 8 illustrates a cross-sectional configuration of a region of the image sensor 400 corresponding to the cross-section taken along line X1-X1' of FIG. 4. For convenience of explanation, in describing FIG. 8, a further description of components and technical aspects previously described with reference to FIGS. 1 to 6C may be omitted.

Referring to FIG. 8, the image sensor 400 has substantially the same configuration as the image sensor 200 described with reference to FIGS. 6A to 6C. However, in the image sensor 400, a source follower transistor SF4 may include a gate dielectric film 422, which is buried in a substrate 102 in the first active area AC1, and a gate electrode SFG4 formed on the gate dielectric film 422. The gate dielectric film 422 of the source follower transistor SF4 may conformally cover an inner surface of a first trench T41. The gate electrode SFG4 of the source follower transistor SF4 may include a buried gate portion 426, which is buried in the substrate 102 in the first active area AC1, and an upper gate portion (refer to 136 in FIG. 5C) in contact with a top surface of the buried gate portion 426.

The first trench T41, the gate dielectric film 422, and the buried gate portion 426 may have substantially the same configurations as the first trench T21, the gate dielectric film 222, and the buried gate portion 226, which are described with reference to FIGS. 6A to 6C. However, a width W4 of the first trench T41 may be about equal or similar to a width (refer to W12 in FIG. 6A) of a second trench T2 in a first lateral direction (X direction). In the first lateral direction (X direction), a width WG41 of the buried gate portion 426 of the source follower transistor SF4 may be less than a width WG2 of a gate electrode SXG of a selection transistor SX.

Figure 9:
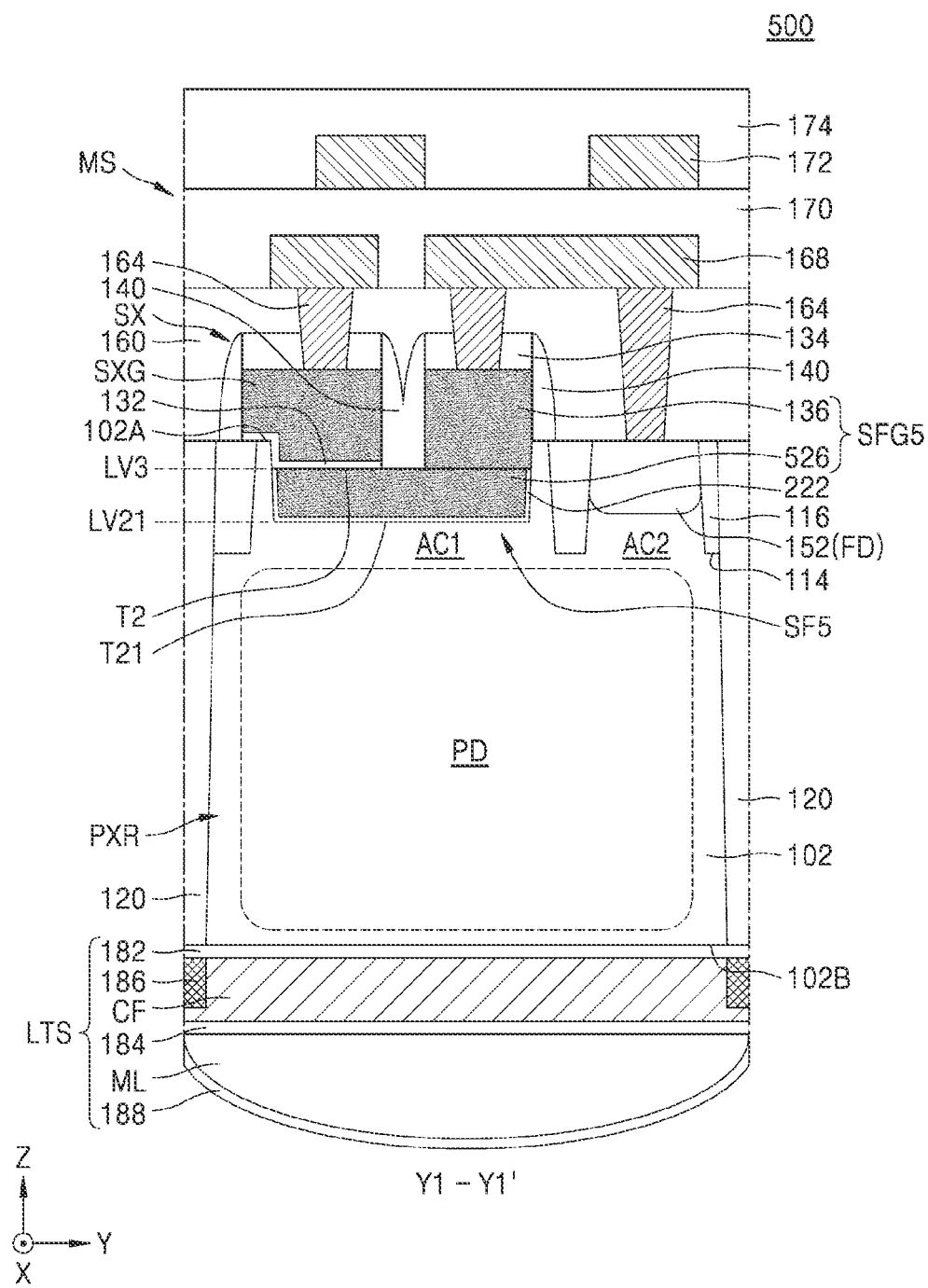
FIG. 9 is a cross-sectional view illustrating an image sensor according to embodiments.

FIG. 9 is a cross-sectional view of an image sensor 500 according to embodiments. FIG. 9 illustrates a cross-sectional configuration of a region of the image sensor 500 corresponding to the cross-section taken along line Y1-Y1' of FIG. 4. For convenience of explanation, in describing FIG. 9, a further description of components and technical aspects previously described with reference to FIGS. 1 to 6C may be omitted.

Referring to FIG. 9, the image sensor 500 has substantially the same configuration as the image sensor 200 described with reference to FIGS. 6A to 6C. However, in the image sensor 500, a gate electrode SFG5 of a source follower transistor SF5 may include a buried gate portion 526 instead of the buried gate portion 226. The buried gate portion 526 may include polysilicon doped with N-type impurities. A dopant concentration of each of the buried gate portion 526 and an upper gate portion 136 of the gate electrode SFG5 may be about equal or similar to a dopant concentration of a gate electrode SXG of a selection transistor SX. The dopant concentration of each of the buried gate portion 526 and the upper gate portion 136 of the gate electrode SFG and the gate electrode SXG of the selection transistor SX may be selected in a range of about $1 \times 10^{11}$/cm³ to about $1 \times 10^{15}$/cm³.

A detailed description of the buried gate portion 526 of the source follower transistor SF5 may be substantially the same as that of the buried gate portion 226, which is given with reference to FIGS. 6A to 6C. Accordingly, a further repeated description is omitted.

Figure 10:
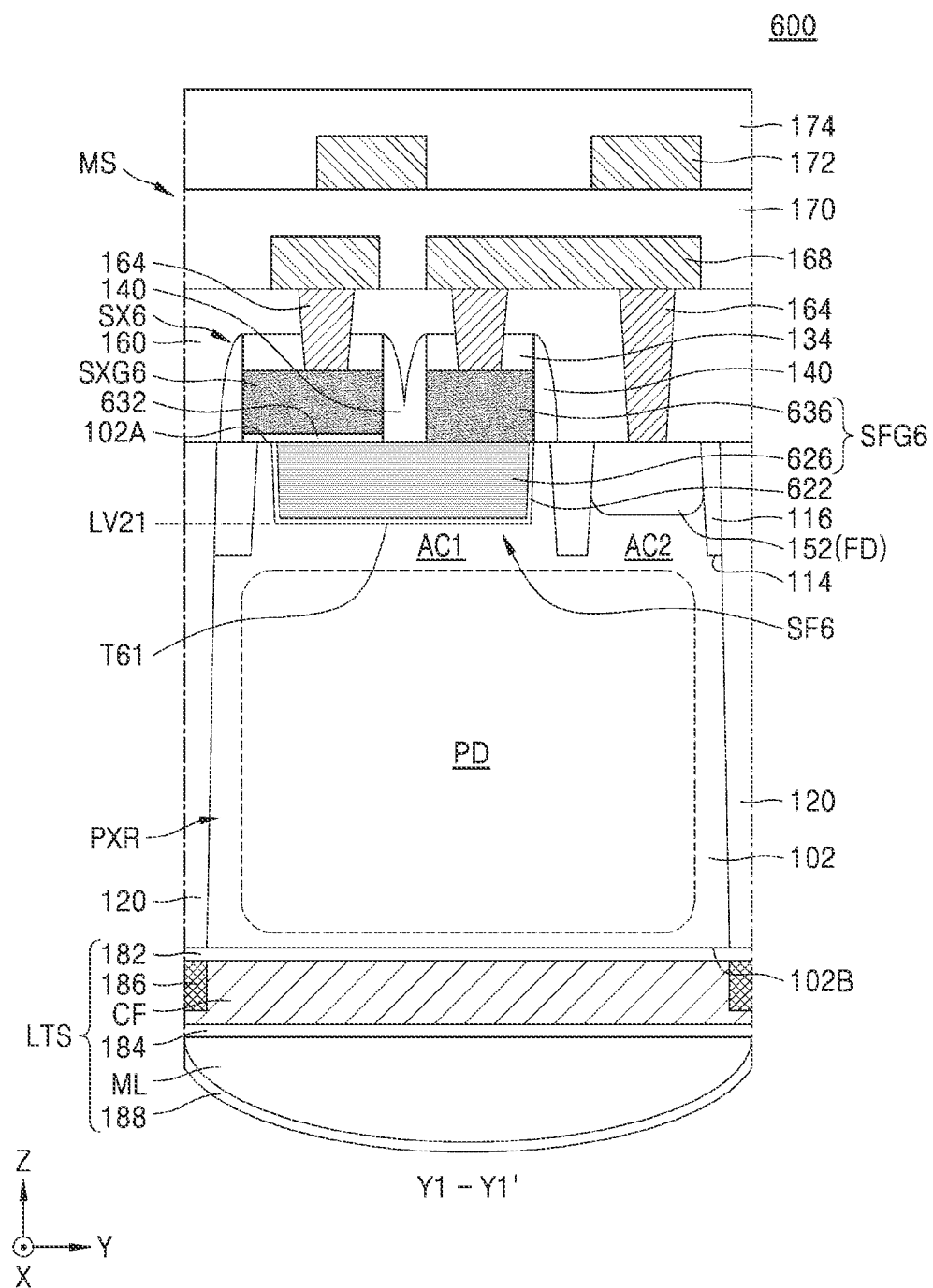
FIG. 10 is a cross-sectional view illustrating an image sensor according to embodiments.

FIG. 10 is a cross-sectional view of an image sensor 600 according to embodiments. FIG. 10 illustrates a cross-sectional configuration of a region of the image sensor 600 corresponding to the cross-section taken along line Y1-Y1' of FIG. 4. For convenience of explanation, in describing FIG. 10, a further description of components and technical aspects previously described with reference to FIGS. 1 to 6C may be omitted.

Referring to FIG. 10, the image sensor 600 has substantially the same configuration as the image sensor 200 described with reference to FIGS. 6A to 6C. However, in the image sensor 600, a source follower transistor SF6 may include a gate dielectric film 622, which conformally covers an inner surface of a first trench T61 formed in a first active area AC1 of a substrate 102, and a gate electrode SFG6 formed on the gate dielectric film 622. The gate electrode SFG6 may include a buried gate portion 626, which fills the first trench T61 on the gate dielectric film 622, and an upper gate portion 636, which is in contact with a top surface of the buried gate portion 626 and on a front side surface 102A of the substrate 102. A level of the top surface of the buried gate portion 626 may be about equal or similar to a level of the front side surface 102A of the substrate 102. In an embodiment, the upper gate portion 636 of the source follower transistor SF6 does not include a portion buried in the substrate 102.

A selection transistor SX6 may include a gate dielectric film 632 and a gate electrode SXG6, which sequentially cover the buried gate portion 626 of the source follower transistor SF6 and the front side surface 102A of the substrate 102. The gate electrode SXG6 of the selection transistor SX6 may overlap the buried gate portion 636 of the source follower transistor SF6 in a vertical direction (Z direction). A level of a lowermost surface of the gate electrode SXG6 of the selection transistor SX6 may be about equal or similar to the level of the front side surface 102A of the substrate 102. The gate electrode SXG6 of the selection transistor SX6 may face the buried gate portion 626 of the source follower transistor SF6 with the gate dielectric film 632 therebetween. In an embodiment, the gate electrode SXG6 of the selection transistor SX6 does not include a portion buried in the substrate 102.

Detailed configurations of the gate dielectric film 622 of the source follower transistor SF6, the buried gate portion 636, and the gate electrode SFG6 including the upper gate portion 636, and detailed configurations of the gate dielectric film 632 and the gate electrode SXG6 of the selection transistor SX6, may be substantially similar to those of the source follower transistor SF2 and the selection transistor SX, which are provided with reference to FIGS. 5A to 5C and 6A to 6C.

In the image sensors 100, 200, 300 400, 500, and 600 described with reference to FIGS. 1 to 10, two gate electrodes of two transistors, that is, the gate electrode SFG, SFG2, SFG3, SFG4, SFG5, or SFG6 of the follower transistor SF, SF2, SF3, SF4, SF5, or SF6 and the gate electrode SXG or SXG6 of the selection transistor SX or SX6, from among a plurality of transistors included in a unit pixel PXU, may overlap in the vertical direction (Z direction). Accordingly, even when the sizes of the unit pixels PXU of the image sensors 100, 200, 300 400, 500, and 600 are reduced, transistors included in the image sensors 100, 200, 300 400, 500 and 600 may maintain stable electrical characteristics by ensuring sufficient channel lengths and current amounts. Thus, an integration density and fill factor may be improved in an image sensor while maintaining excellent sensitivity and color filtering.

Figure 11A:
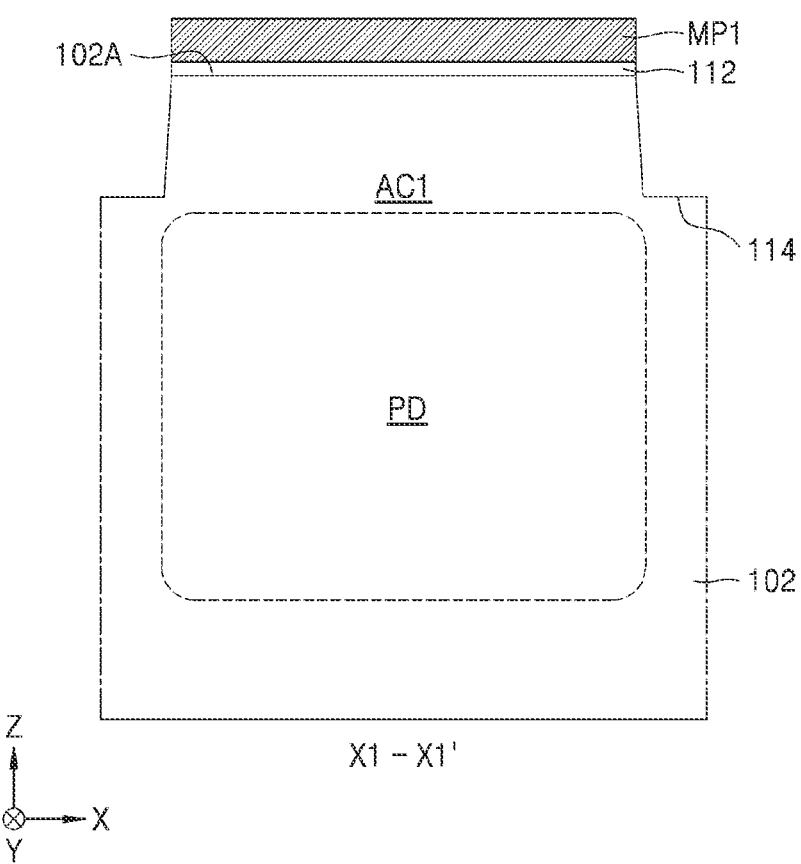
FIGS. 11A to 20C are diagrams illustrating a method of manufacturing an image sensor, according to embodiments, in which FIGS. 11A, 12A, . . . , and 20A are cross-sectional views, according to a process sequence, illustrating a region of the image sensor corresponding to the cross-section taken along line X1-X1' of FIG. 4, FIGS. 11B, 12B, . . . , and 20B are cross-sectional views, according to a process sequence, illustrating a region of the image sensor corresponding to the cross-section taken along line X2-X2' of FIG. 4, and FIGS. 11C, 12C, . . . , and 20C are cross-sectional views, according to a process sequence, illustrating a region of the image sensor corresponding to the cross-section taken along line Y1-Y1' of FIG. 4.

FIGS. 11A to 20C are cross-sectional views illustrating a method of manufacturing an image sensor 100, according to embodiments. FIGS. 11A, 12A, . . . , and 20A are cross-sectional views, according to a process sequence, illustrating a region of the image sensor 100 corresponding to the cross-section taken along line X1-X1' of FIG. 4. FIGS. 11B, 12B, . . . , and 20B are cross-sectional views, according to a process sequence, illustrating a region of the image sensor 100 corresponding to the cross-section taken along line X2-X2' of FIG. 4. FIGS. 11C, 12C, . . . , and 20C are cross-sectional views, according to a process sequence, illustrating a region of the image sensor 100 corresponding to the cross-section taken along line Y1-Y1' of FIG. 4. An example method of manufacturing the image sensor 100 described with reference to FIGS. 4 and 5A to 5C will be described with reference to FIGS. 11A to 20C.

Figure 11B:
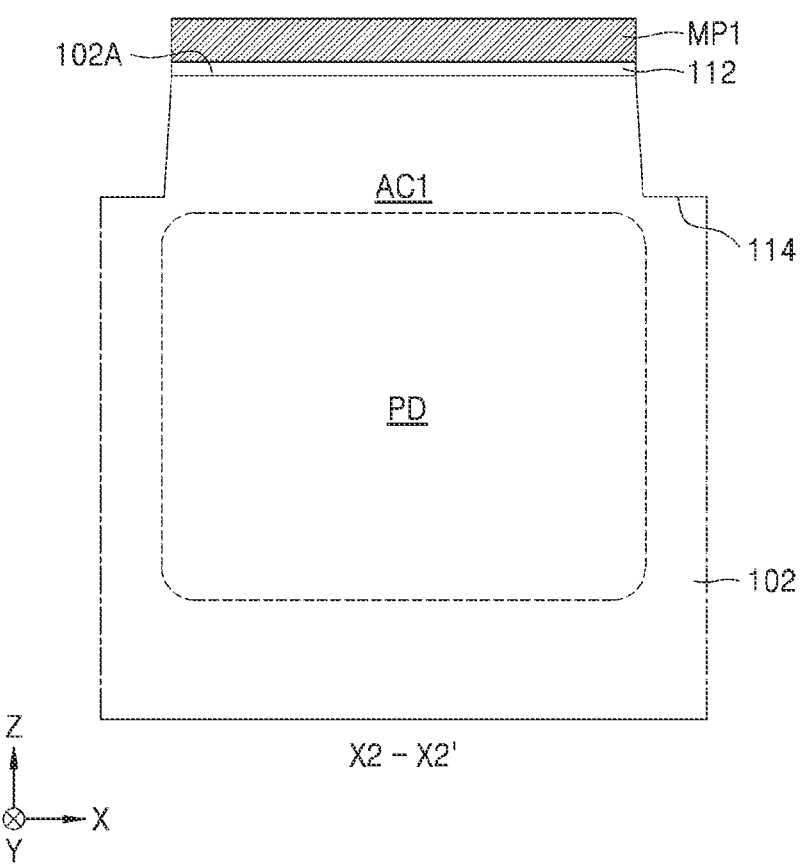
Figure 11C:
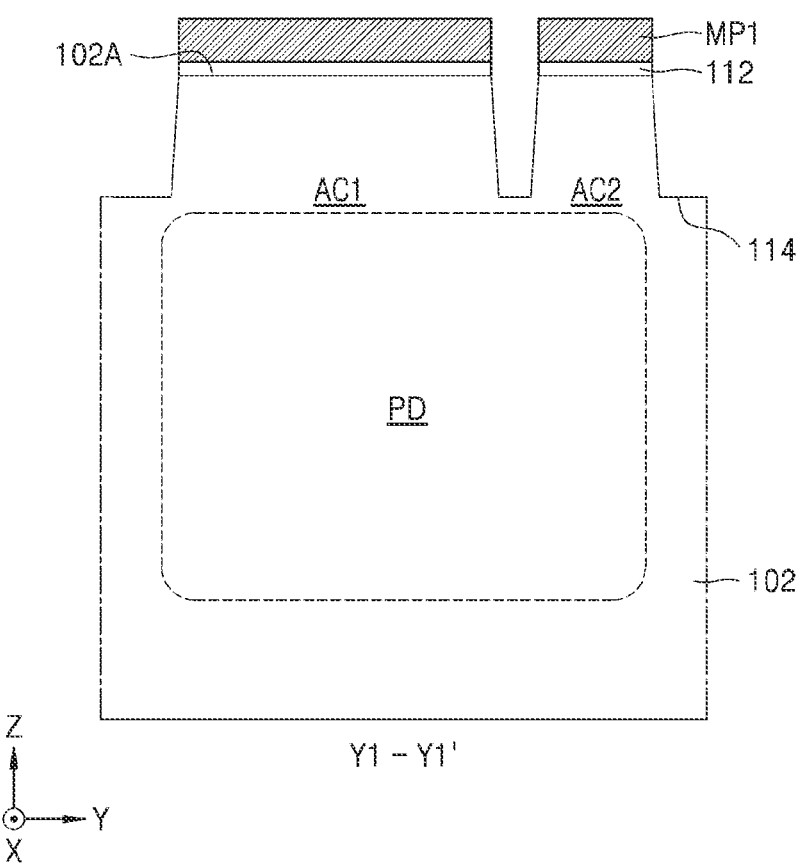

Referring to FIGS. 11A to 11C, a photodiode PD may be formed in a substrate 102, and a buffer oxide film 112 and a mask pattern MP1 may be formed on a front side surface 102A of the substrate 102. The substrate 102 may be anisotropically etched using the mask pattern MP1 as an etch mask to form a device isolation trench 114. A plurality of active areas (e.g., the first to third active areas AC1, AC2, and AC3 in FIG. 4) may be defined by the device isolation trench 114 in the substrate 102.

In example embodiments, to form the photodiode PD, an ion implantation mask pattern having a plurality of openings corresponding to a plurality of pixel areas (refer to PXR in FIGS. 4A to 4D) may be formed on the front side surface 102A of the substrate 102, and N-type impurities may be doped into the substrate 102 by using the ion implantation mask pattern. After the photodiode PD is formed, the ion implantation mask pattern may be removed.

In example embodiments, the mask pattern MP1 may include a silicon nitride film or a silicon oxynitride film. A lowermost surface of the device isolation trench 114 may be apart from the photodiode PD. In example embodiments, the process of forming the device isolation trench 114 may be performed before the process of forming the photodiode PD. In example embodiments, the process of forming the device isolation trench 114 may be performed after the process of forming the photodiode PD.

Figure 12A:
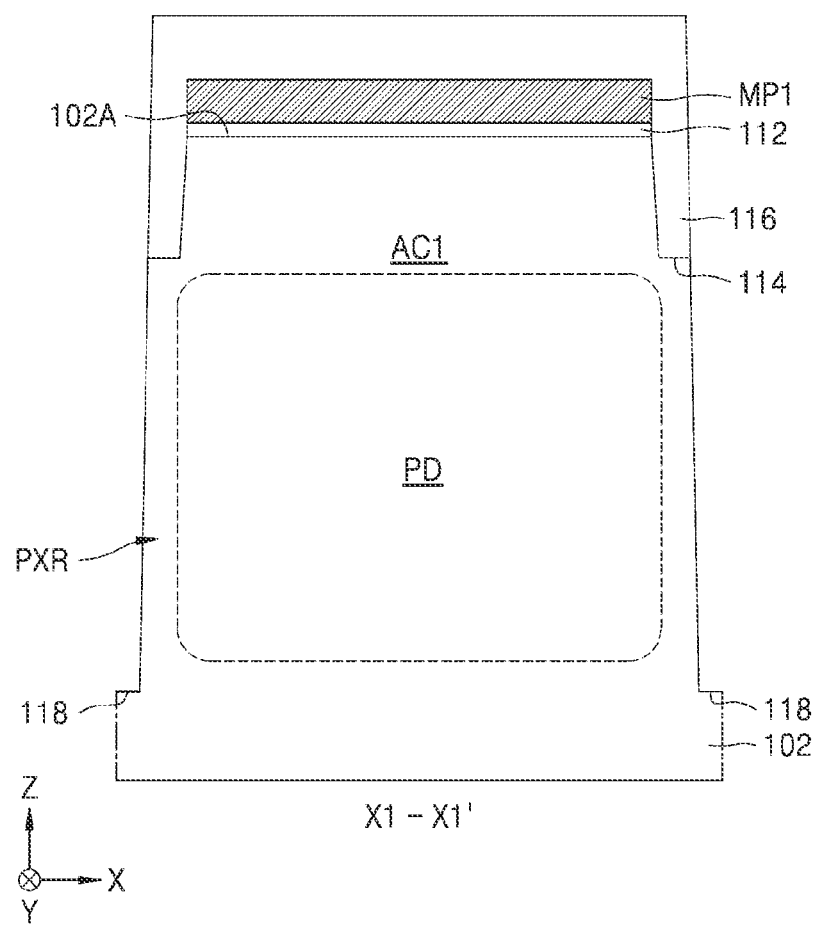
Figure 12B:
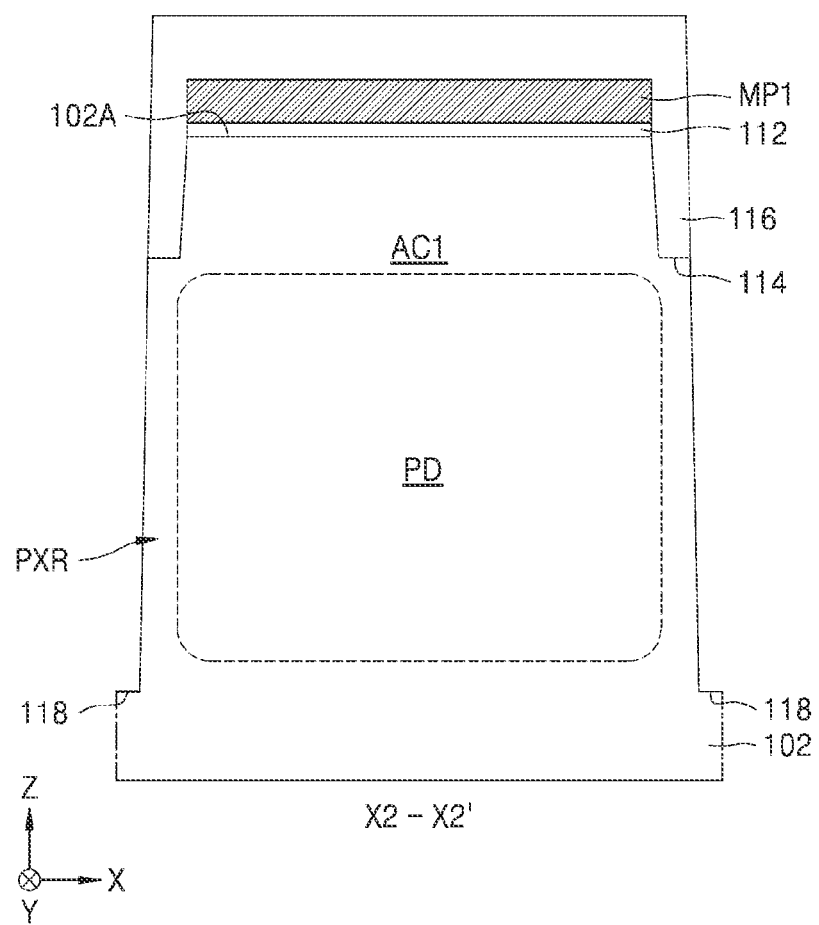
Figure 12C:
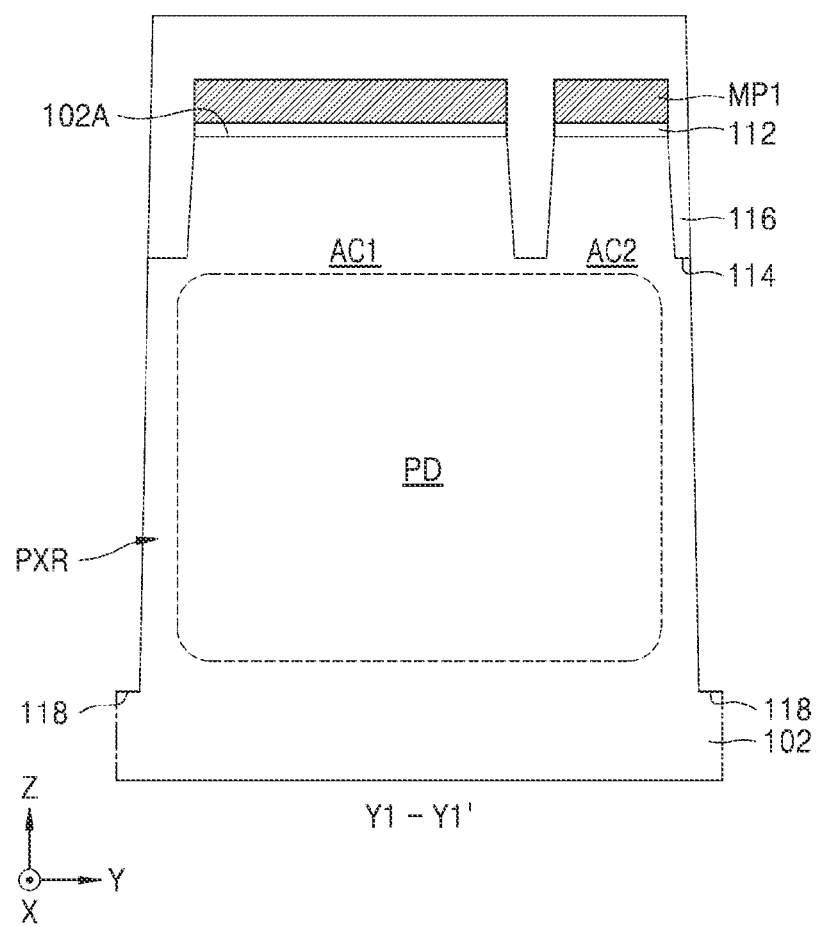

Referring to FIGS. 12A to 12C, a device isolation insulating film 116 may be formed to fill the device isolation trench 114 and cover a top surface of the mask pattern MP1. A portion of the device isolation insulating film 116 and a portion of the substrate 102 may be etched to form a pixel isolation trench 118. The pixel isolation trench 118 may be formed near the photodiode PD to surround the photodiode PD. The pixel area PXR may be defined by the pixel isolation trench 118 in the substrate 102.

Figure 13A:
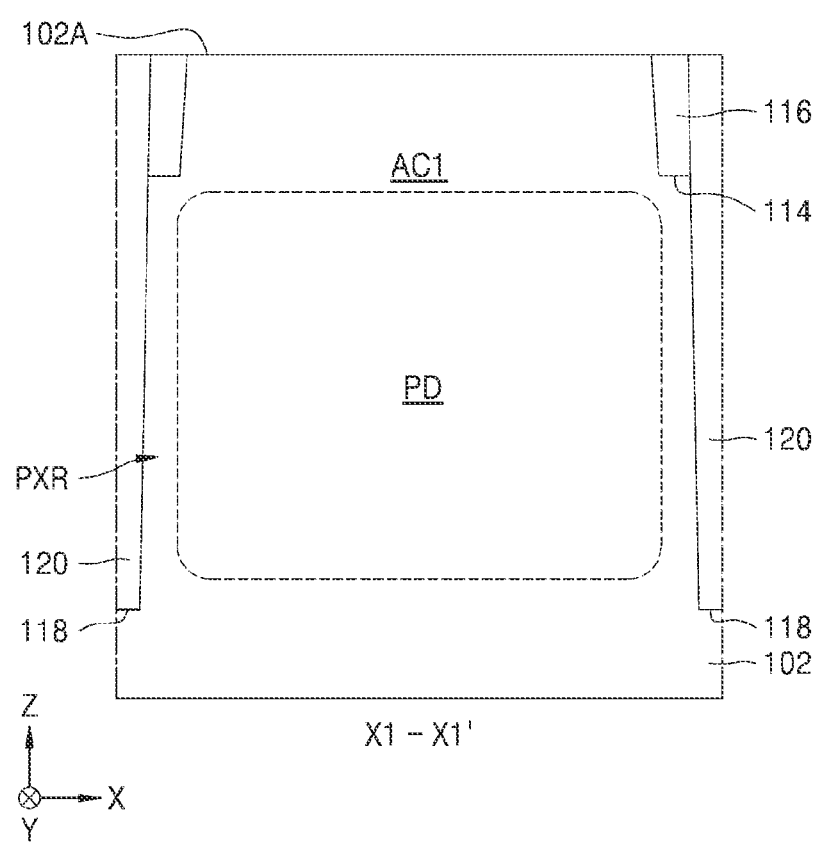
Figure 13B:
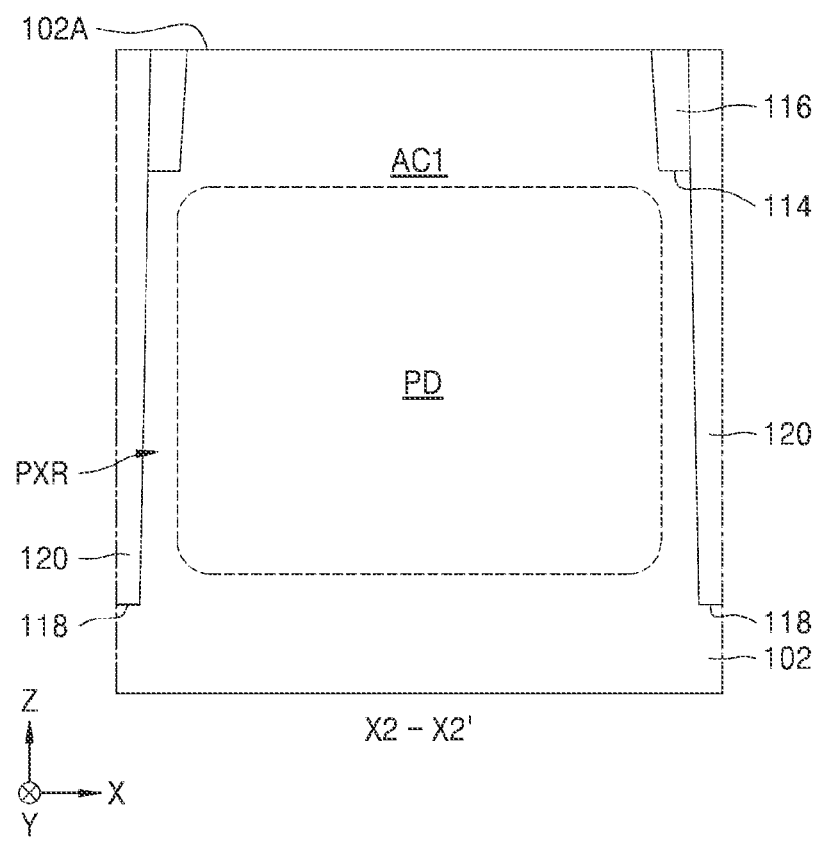
Figure 13C:
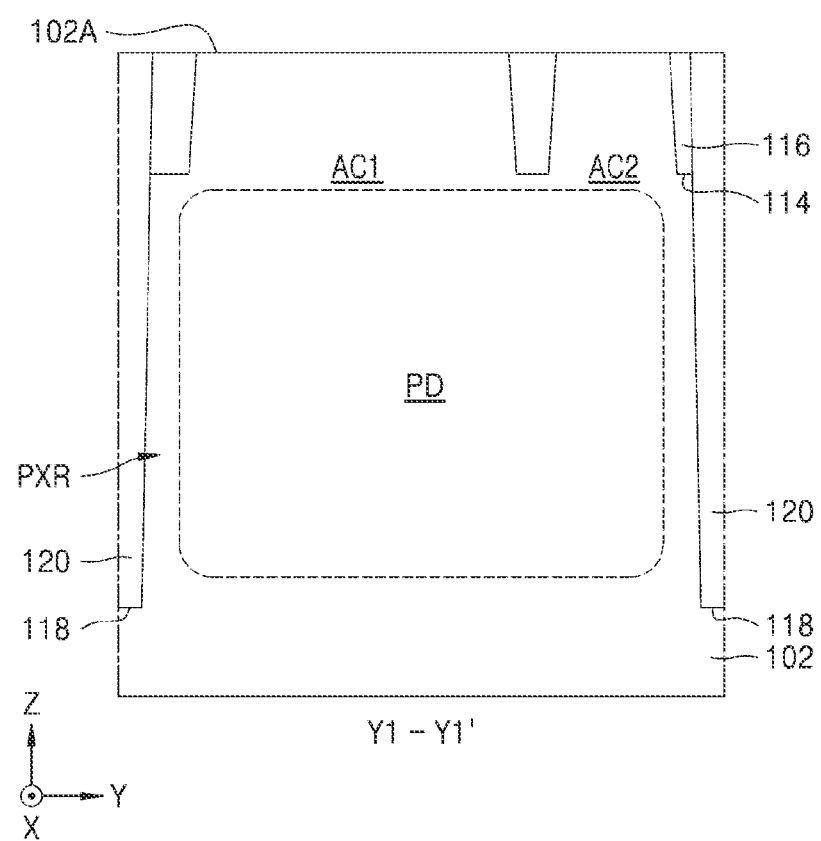

Referring to FIGS. 13A to 13C, an insulating film may be formed to cover the resultant structure of FIGS. 12A to 12C and fill the pixel isolation trench 118. The resultant structure including the insulating film may be planarized to remove the mask pattern MP1 and the buffer oxide film 112 and expose the front side surface 102A of the substrate 102. As a result, a portion of the insulating film, which fills the pixel isolation trench 118, may be left as a pixel isolation insulating film 120.

Figure 14A:
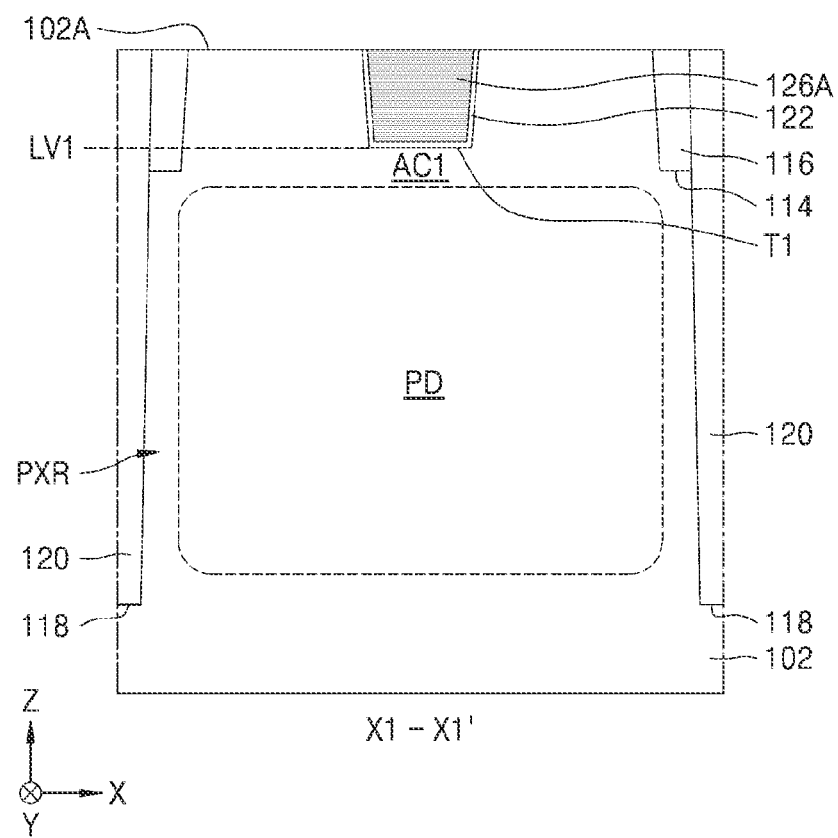
Figure 14B:
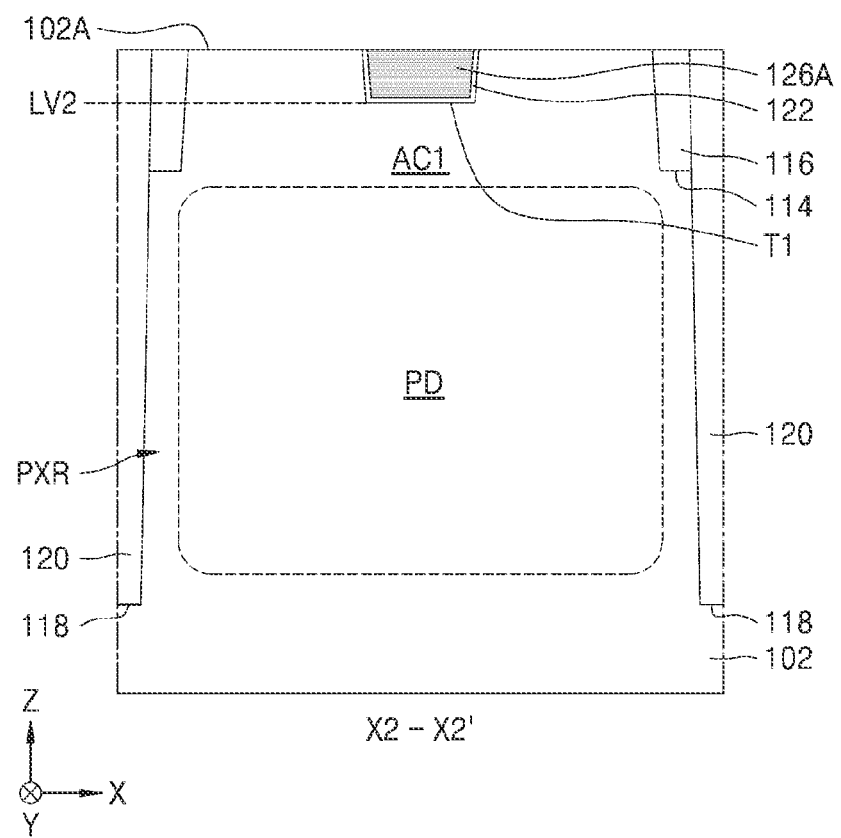
Figure 14C:
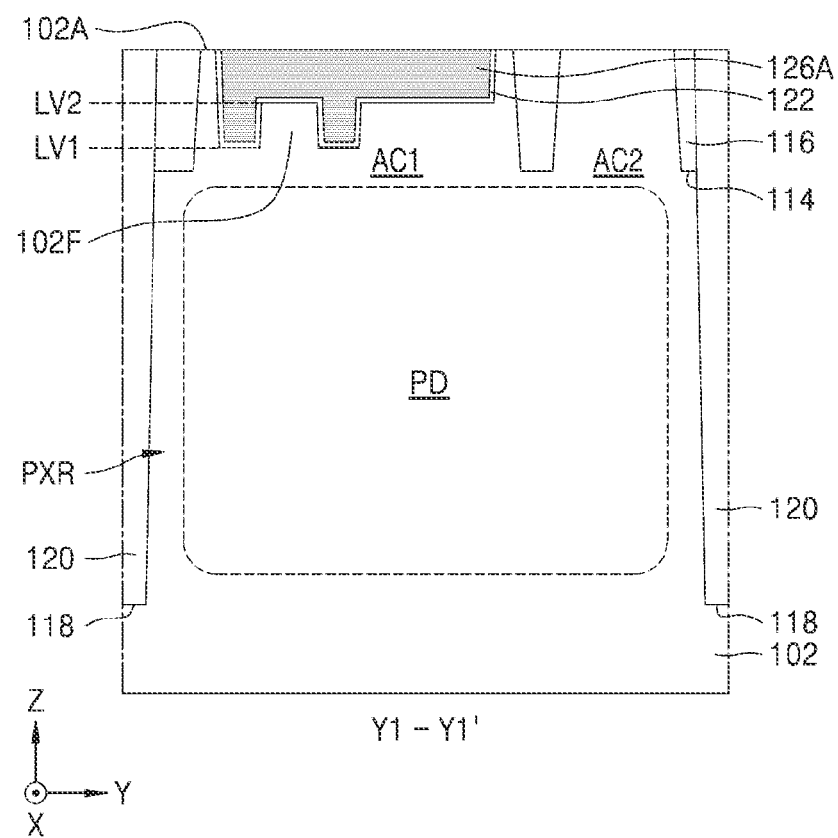

Referring to FIGS. 14A to 14C, by performing an etching process on the front side surface 102A of the substrate 102 in the resultant structure of FIGS. 13A to 13C, a partial region of the substrate 102 may be etched to form a first trench T1. A gate dielectric film 122 and a first conductive pattern 126A may be formed inside the first trench T1.

The first trench T1 may be formed to include a step in a bottom surface thereof. Thus, after the first trench T1 is formed, a fin region 102F may be formed in the first active area AC1 of the substrate 102. A lowermost portion of the bottom surface of the first trench T1 may be at a first level LV1, which is spaced a first vertical distance apart from the front side surface 102A of the substrate 102 toward the inside of the substrate 102. A portion of the bottom surface of the first trench T1, which corresponds to a top surface of the fin region 102F, may be at a second level LV2, which is spaced a second vertical distance apart from the front side surface 102A of the substrate 102 toward the inside of the substrate 102. Here, the second vertical distance may be less than the first vertical distance.

In example embodiments, to form the gate dielectric film 122 and the first conductive pattern 126A, initially, a process of oxidizing an exposed surface of the substrate 102 in which the first trench T1 is formed may be performed to form the gate dielectric film 122 conformally covering an inner surface of the first trench T1. Thereafter, a polysilicon film may be formed on the gate dielectric film 122 to fill the first trench T1. A planarization process may be performed on the obtained resultant structure to expose the front side surface 102A of the substrate 102, and thus, the gate dielectric film 122 and unnecessary portions of the polysilicon film may be removed. N-type impurities may be doped into the polysilicon film remaining inside the first trench T1, thereby forming the first conductive pattern 126A including doped polysilicon. However, according to embodiments, the processes of forming the gate dielectric film 122 and the first conductive pattern 126A are not limited to the above illustration, and various modifications and changes may be made according to embodiments of the inventive concept.

Figure 15A:
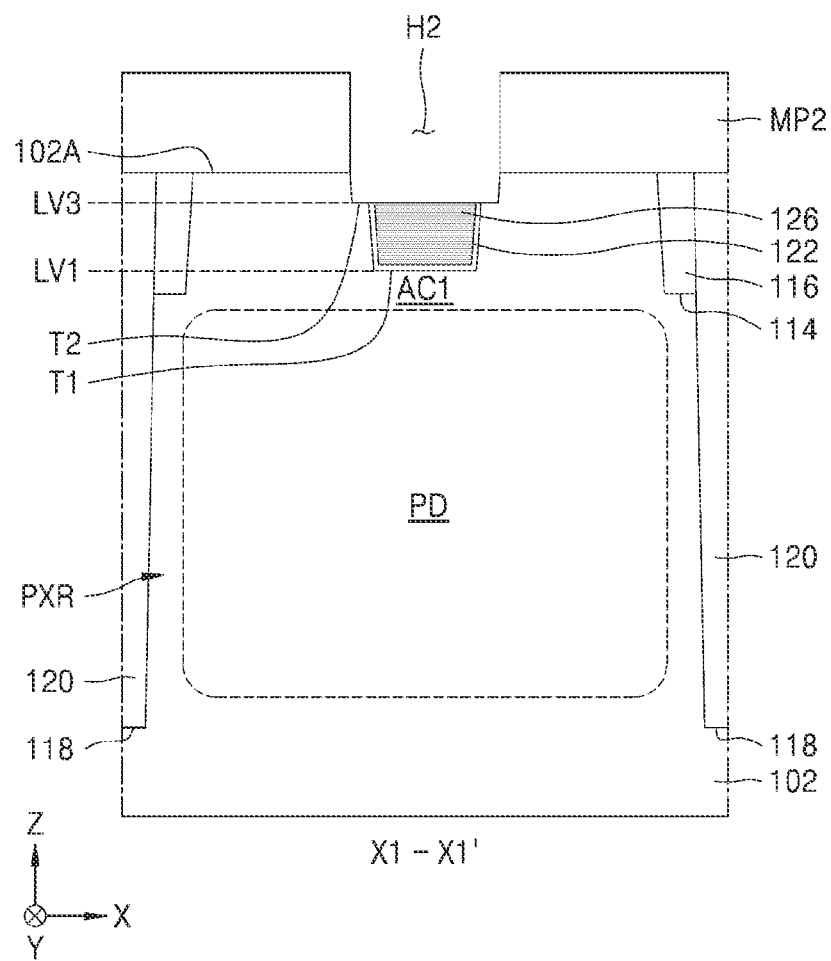
Figure 15B:
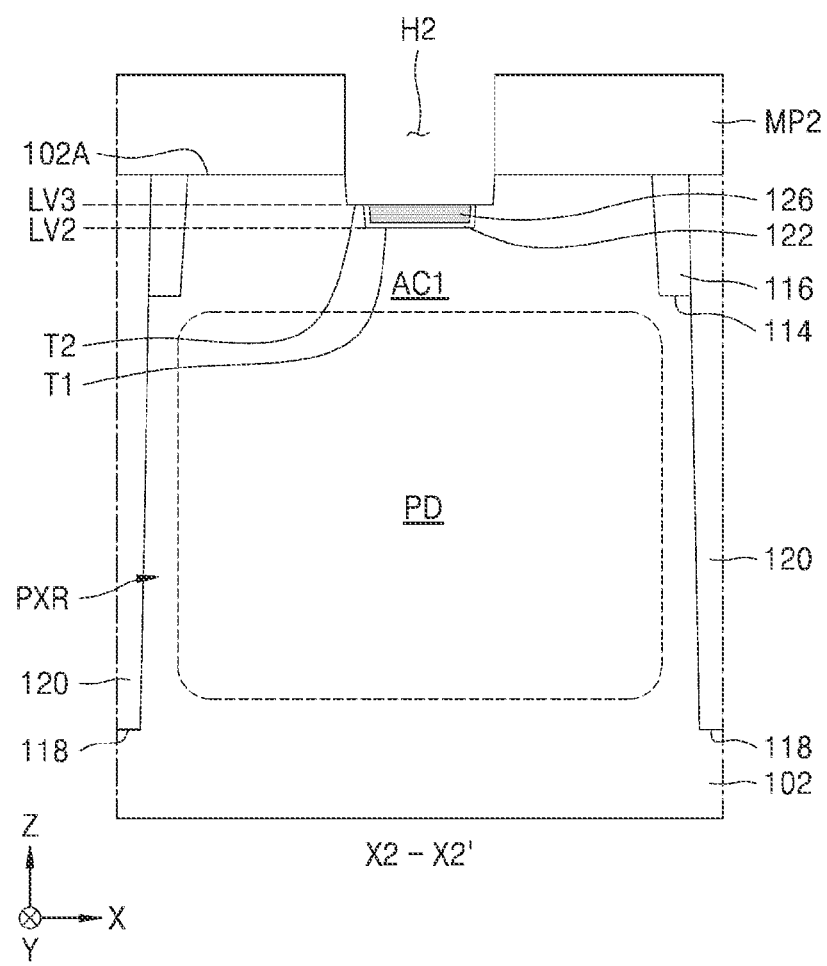
Figure 15C:
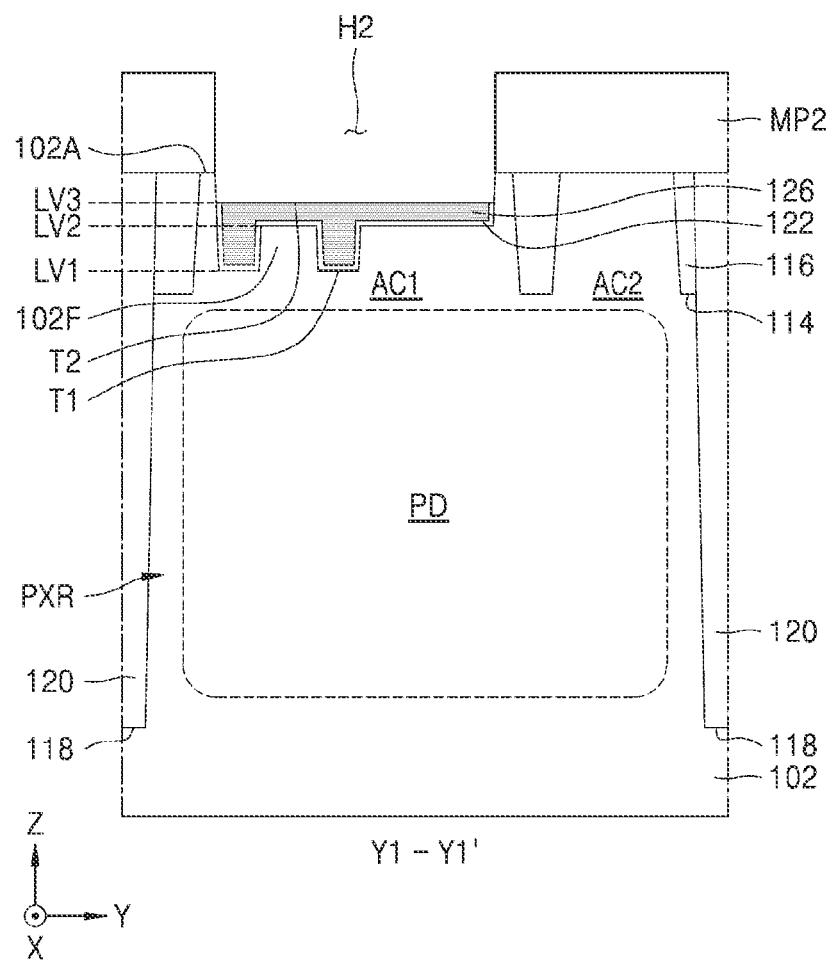

Referring to FIGS. 15A to 15C, in the resultant structure of FIGS. 14A to 14C, a mask pattern MP2 including an opening H2 exposing the gate dielectric film 122 and the first conductive pattern 126A may be formed on the substrate 102. A portion of each of the gate dielectric film 122, the first conductive pattern 126A, and the substrate 102 may be etched using the mask pattern MP2 as an etch mask to form a second trench T2. In example embodiments, the mask pattern MP2 may include a photoresist pattern. However, embodiments are not limited thereto.

During the formation of the second trench T2, a portion of each of the gate dielectric film 122 and the first conductive pattern 126A may be removed. After the second trench T2 is formed, the first conductive pattern 126A remaining in the first trench T1 may constitute a buried gate portion 126 of a source follower transistor SF.

A lowermost portion of the second trench T2 may extend in a lateral direction at a third level LV3, which is higher than the second level LV2 and lower than a level of the front side surface 102A of the substrate 102. The gate dielectric film 122 and the buried gate portion 126 may be exposed at a bottom surface of the second trench T2.

Figure 16A:
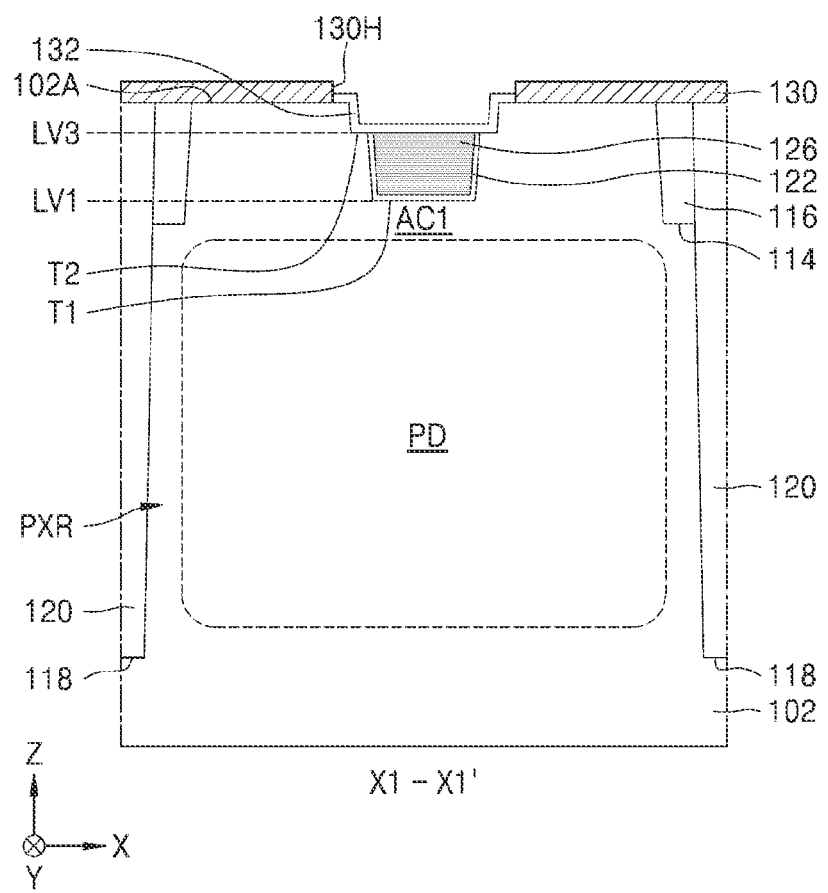
Figure 16B:
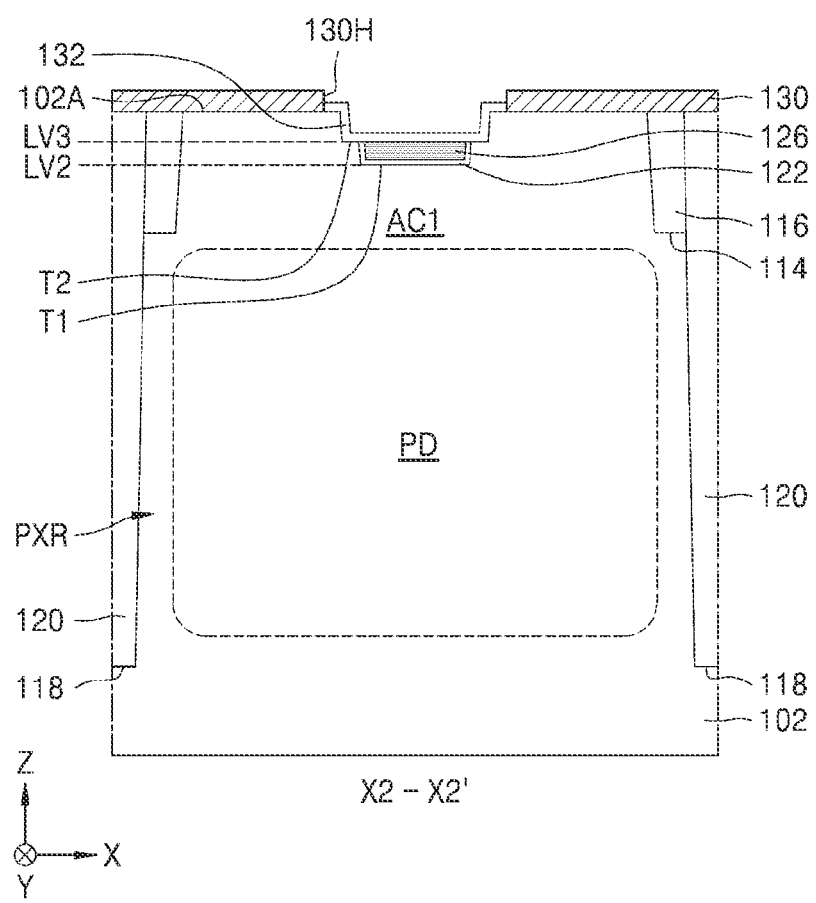
Figure 16C:
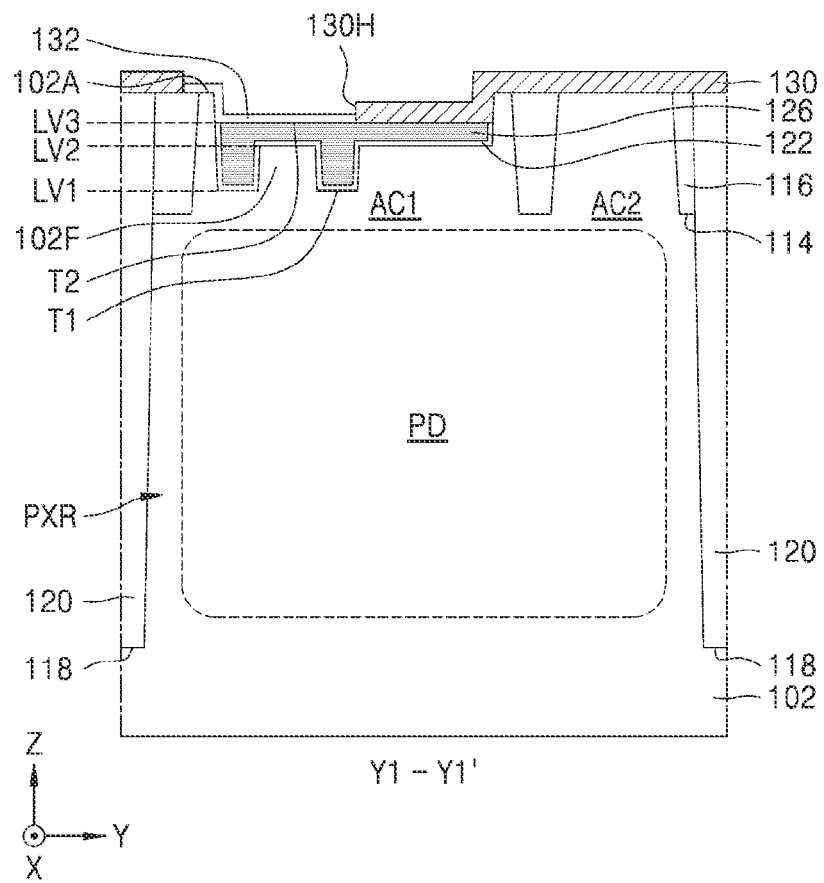

Referring to FIGS. 16A to 16C, the mask pattern MP2 may be removed from the resultant structure of FIGS. 15A to 15C to expose a top surface of each of the front side surface 102A of the substrate 102, the device isolation insulating film 116, and the pixel isolation insulating film 120.

A mask pattern 130 may be formed on the resultant structure from which the mask pattern MP2 is removed. The mask pattern 130 may have an opening 130H exposing a portion of each of the gate dielectric film 122, the buried gate portion 126, and the substrate 102 on the first active area AC1. In example embodiments, the mask pattern 130 may include a silicon nitride film.

A gate dielectric film 132 may be formed to cover a surface of the buried gate portion 126 and a surface of the substrate 102, which are exposed by the opening 130H of the mask pattern 130. In example embodiments, to form the gate dielectric film 132, a process of oxidizing the surface of the buried gate portion 126 and the surface of the substrate 102, which are exposed through the opening 130H of the mask pattern 130, may be performed. In example embodiments, the gate dielectric film 132 may be formed using a chemical vapor deposition (CVD) process or an atomic layer deposition (ALD) process.

The gate dielectric film 132 may conformally cover the surface of the buried gate portion 126 and the surface of the substrate 102. A thickness of the gate dielectric film 132 may be greater than a thickness of the gate dielectric film 122 of the source follower transistor SF.

In example embodiments, during the formation of the gate dielectric film 132, a plurality of gate dielectric films may also be formed on the second and third active areas AC2 and AC3 of the substrate 102. The plurality of gate dielectric films formed on the second and third active areas AC2 and AC3 may include gate dielectric films, which constitute the first and second transfer transistors TX1 and TX2 and the reset transistor RX, which are described with reference to FIG. 2, or include gate dielectric films, which constitute the first to fourth transfer transistors TX1, TX2, TX3 and TX4 and the reset transistor RX, which are described with reference to FIG. 3.

Figure 17A:
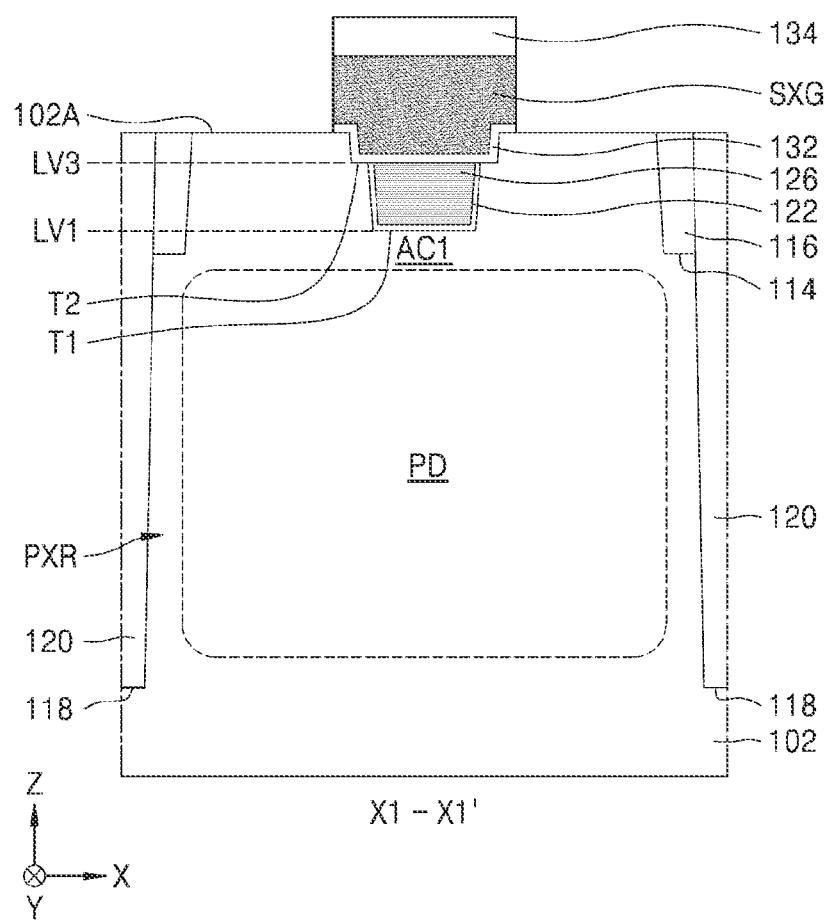
Figure 17B:
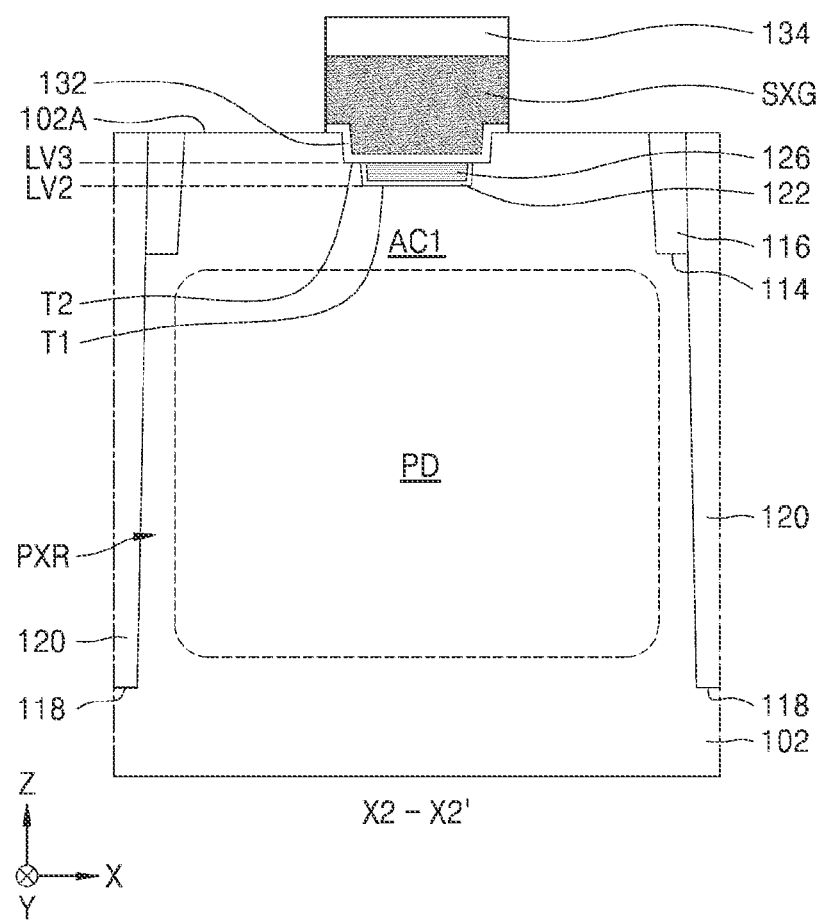
Figure 17C:
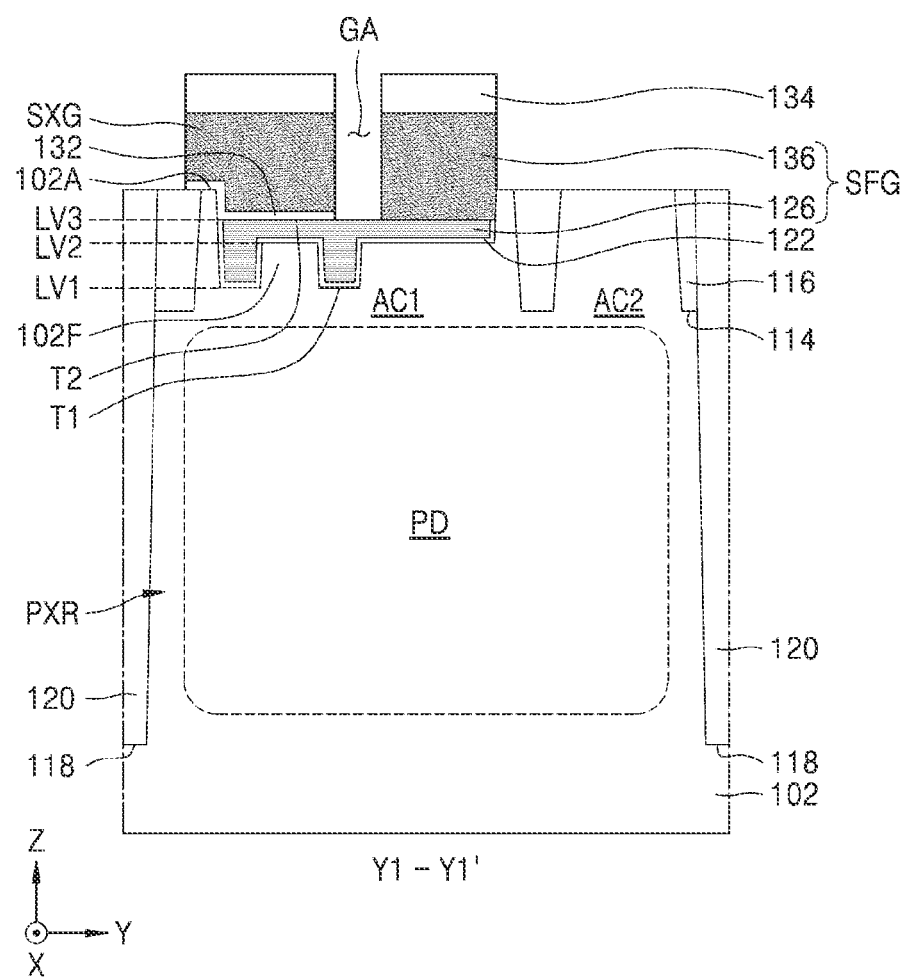

Referring to FIGS. 17A to 17C, the mask pattern 130 may be removed from the resultant structure of FIGS. 16A to 16C to expose the front side surface 102A of the substrate 102 and a top surface of the buried gate portion 126. A second conductive layer, which is in contact with the top surface of the buried gate portion 126 and a top surface of the gate dielectric film 132, may be formed. Thereafter, a plurality of insulating capping patterns 134 may be formed on the second conductive layer. In an example process for forming the second conductive layer, after the mask pattern 130 is removed from the resultant structure of FIGS. 16A to 16C, a doped polysilicon film may be formed to cover the obtained resultant structure.

A portion of each of the second conductive layer and the gate dielectric film 132 may be removed using the plurality of insulating capping patterns 134 as an etch mask. Thus, an upper gate portion 136 of the source follower transistor SF and a gate electrode SXG of a selection transistor SX, which include portions of the second conductive layer, which remain on the first active area AC1, may be formed.

As shown in FIG. 17C, the upper gate portion 136 of the source follower transistor SF and the gate electrode SXG of the selection transistor SX may be apart from each other in a second lateral direction (Y direction) with a gap area GA therebetween. The top surface of the buried gate portion 126 may be exposed through the gap area GA.

In the resultant structure of FIGS. 17A to 17C, the buried gate portion 126 and the upper gate portion 136 may constitute a gate electrode SFG of the source follower transistor (refer to SF in FIGS. 5A to 5C).

In example embodiments, during the formation of the upper gate portion 136 and the gate electrode SXG in the process described with reference to FIGS. 17A to 17C, gate structures that constitute MOS transistors included in readout circuits may be formed on the front side surface 102A of the substrate 102 together with the upper gate portion 136 and the gate electrode SXG. For example, during the formation of the upper gate portion 136 and the gate electrode SXG, gate structures that constitute the first and second transfer transistors TX1 and TX2 and the reset transistor RX, which are described with reference to FIG. 2, or gate structures that constitute the first to fourth transfer transistors TX1 and TX2, TX3, and TX4 and the reset transistor RX, which are described with reference to FIG. 3, may be formed simultaneously.

Figure 18A:
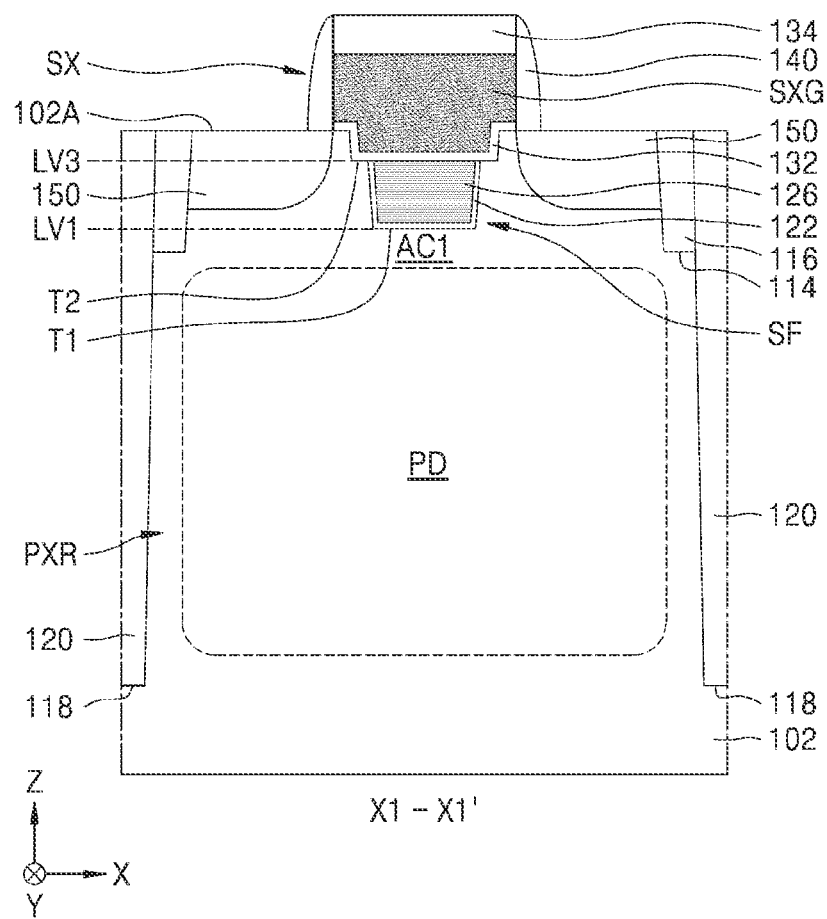
Figure 18B:
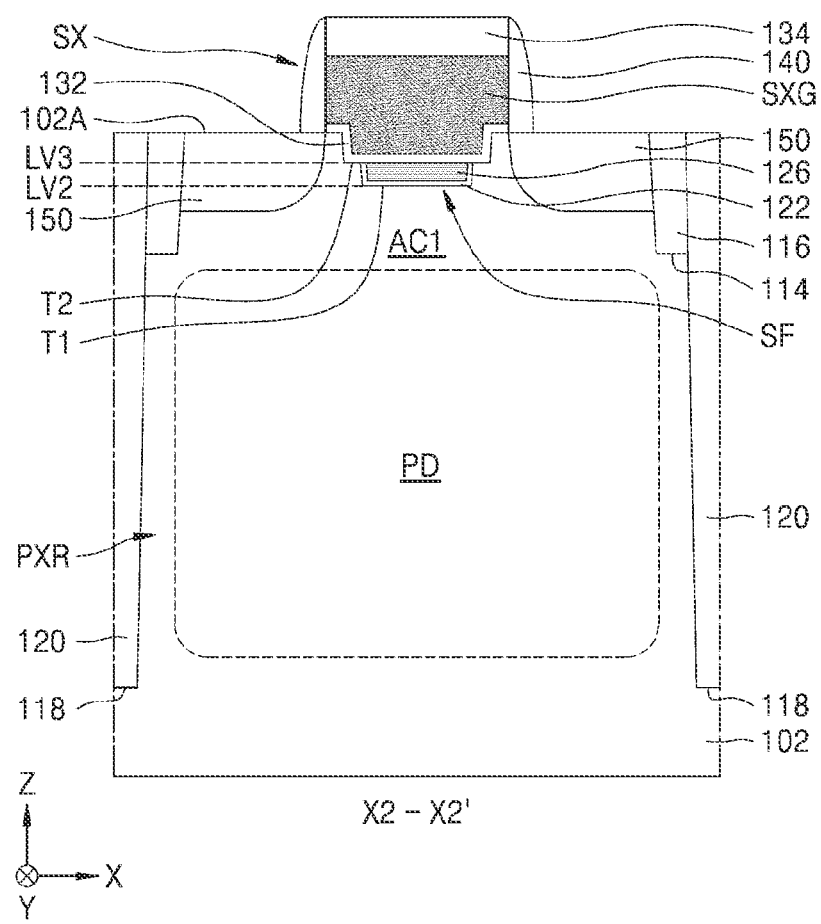
Figure 18C:
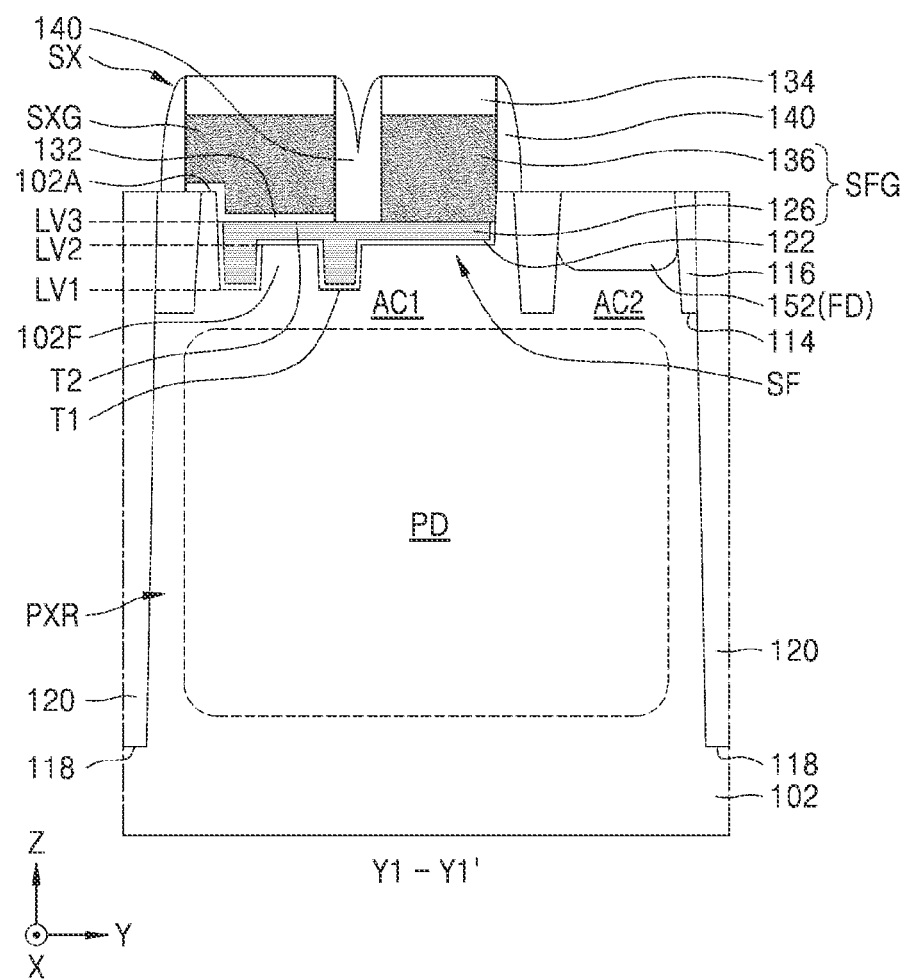

Referring to FIGS. 18A to 18C, in the resultant structure of FIGS. 17A to 17C, a plurality of insulating spacers 140 may be formed to cover sidewalls of the upper gate portion 136, the gate electrode SXG, and the plurality of insulating capping patterns 134. Impurity ions may be implanted into the first to third active areas (refer to AC1, AC2, and AC3 in FIGS. 5A to 5C) to form a plurality of impurity regions. The plurality of impurity regions may include the impurity regions 150, 152, and 154 described with reference to FIGS. 4 and 5A to 5C. A pair of impurity regions 150 formed in the first active area AC1, from among the impurity regions 150, 152, and 154, may operate as a source and a drain of each of the source follower transistor SF and the selection transistor SX. The impurity region 152 formed in the second active area AC2 may constitute a floating diffusion region FD.

As shown in FIG. 18C, in the second lateral direction (Y direction), the gap area (refer to GA in FIG. 17C) between the upper gate portion 136 of the source follower transistor SF and the gate electrode SXG of the selection transistor SX may be filled with an insulating spacer 140. The insulating spacer 140 filling the gap area (refer to GA in FIG. 17C) may be in contact with the top surface of the buried gate portion 126.

Figure 19A:
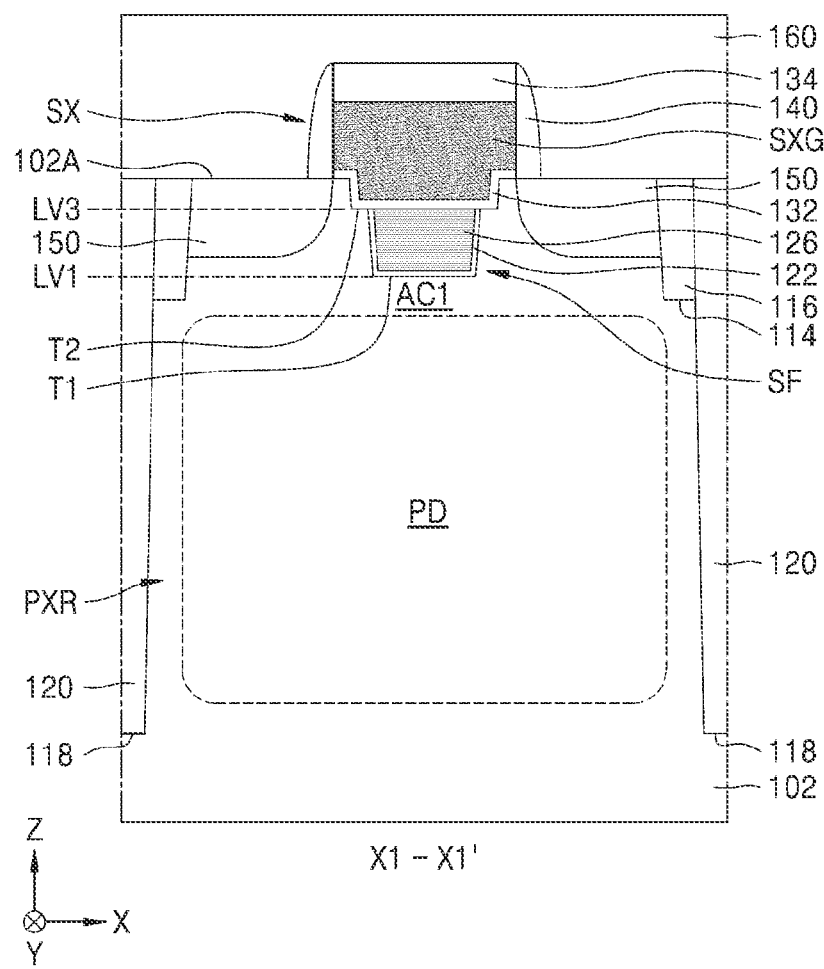
Figure 19B:
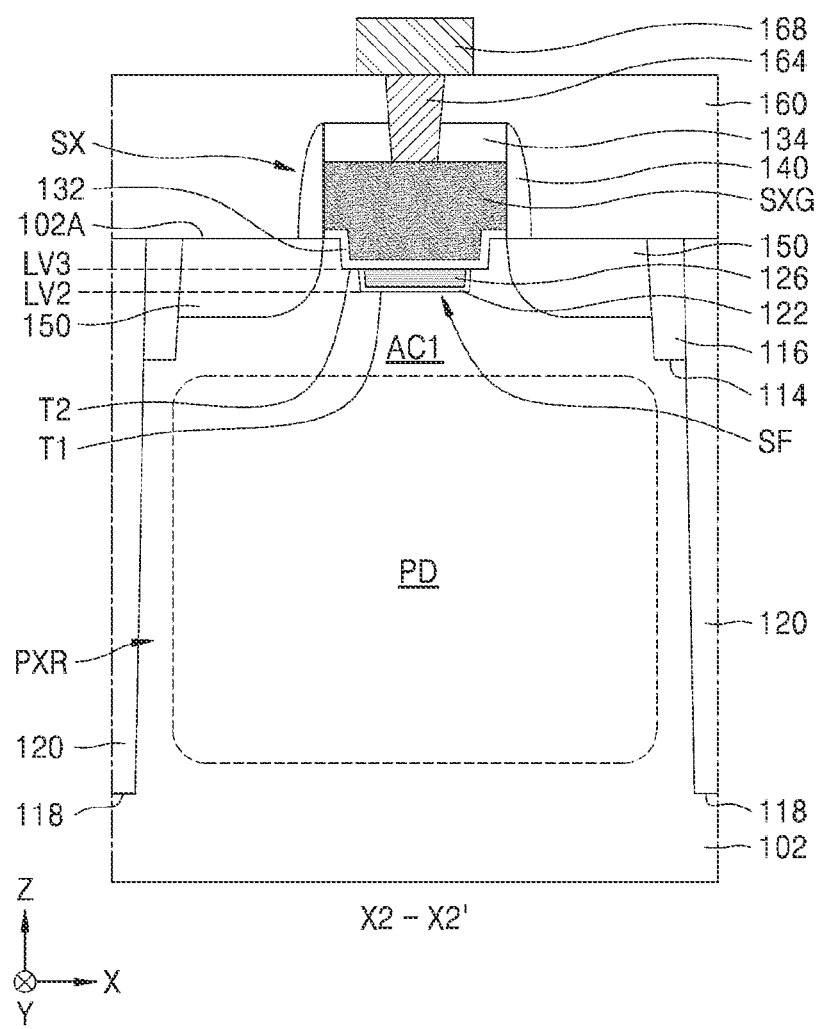
Figure 19C:
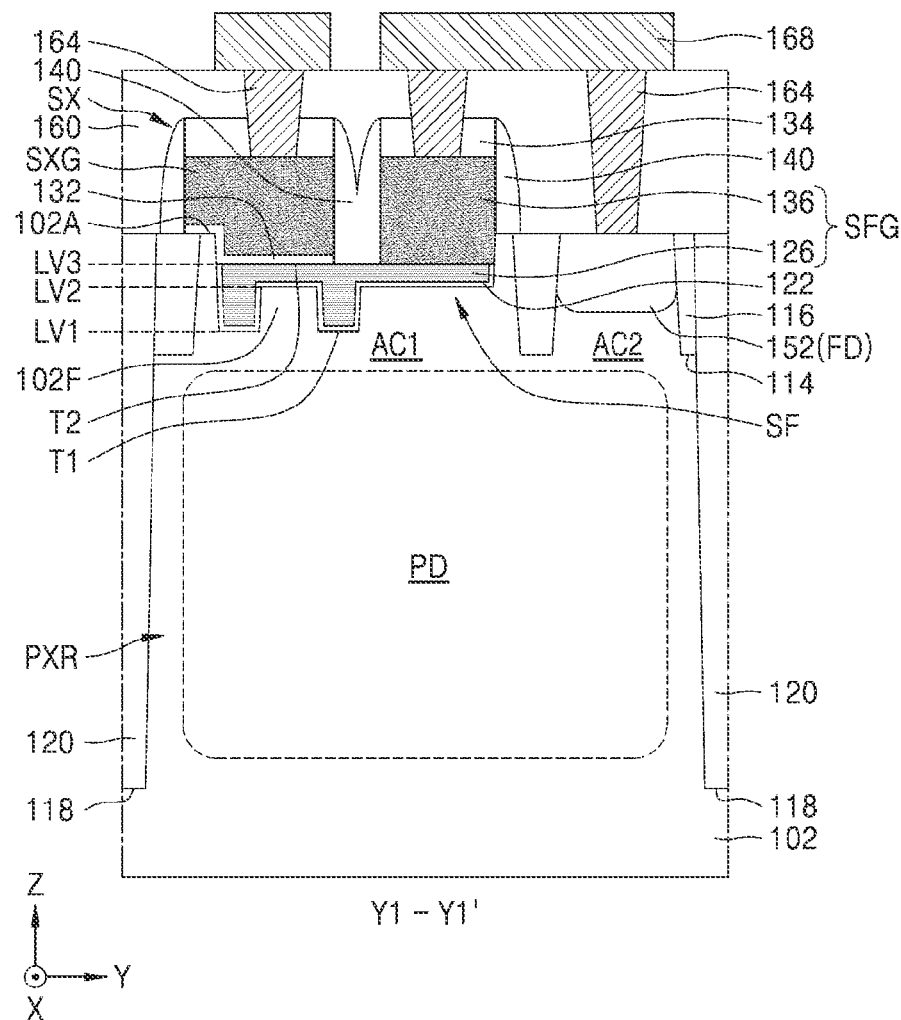

Referring to FIGS. 19A to 19C, in the resultant structure of FIGS. 18A to 18C, an interlayer insulating film 160 may be formed to cover the front side surface 102A of the substrate 102 and a plurality of transistors including the source follower transistor SF and the selection transistor SX. Thereafter, a plurality of contact plugs 164 may be formed to pass through the interlayer insulating film 160 and be connected to the plurality of transistors. A plurality of conductive lines 168 may be formed on the interlayer insulating film 160. The plurality of conductive lines 168 may be connected to the plurality of transistors through the plurality of contact plugs 164.

The plurality of contact plugs 164 may include a plurality of contact plugs 164, which are respectively connected to the upper gate portion 136 of the source follower transistor SF, the gate electrode SXG of the selection transistor SX, and the plurality of impurity regions (e.g., 150, 152, and 154 of FIG. 4). In an embodiment, the plurality of contact plugs 164 may further include contact plugs, which are respectively connected to the gate structures, which constitute the first and second transfer transistors TX1 and TX2 and the reset transistor RX described with reference to FIG. 2, and the impurity regions, or further include contact plugs, which are respectively connected to the gate structures, which constitute the first to fourth transfer transistors TX1, TX2, TX3, and TX4 and the reset transistor RX described with reference to FIG. 3, and the impurity regions.

Figure 20A:
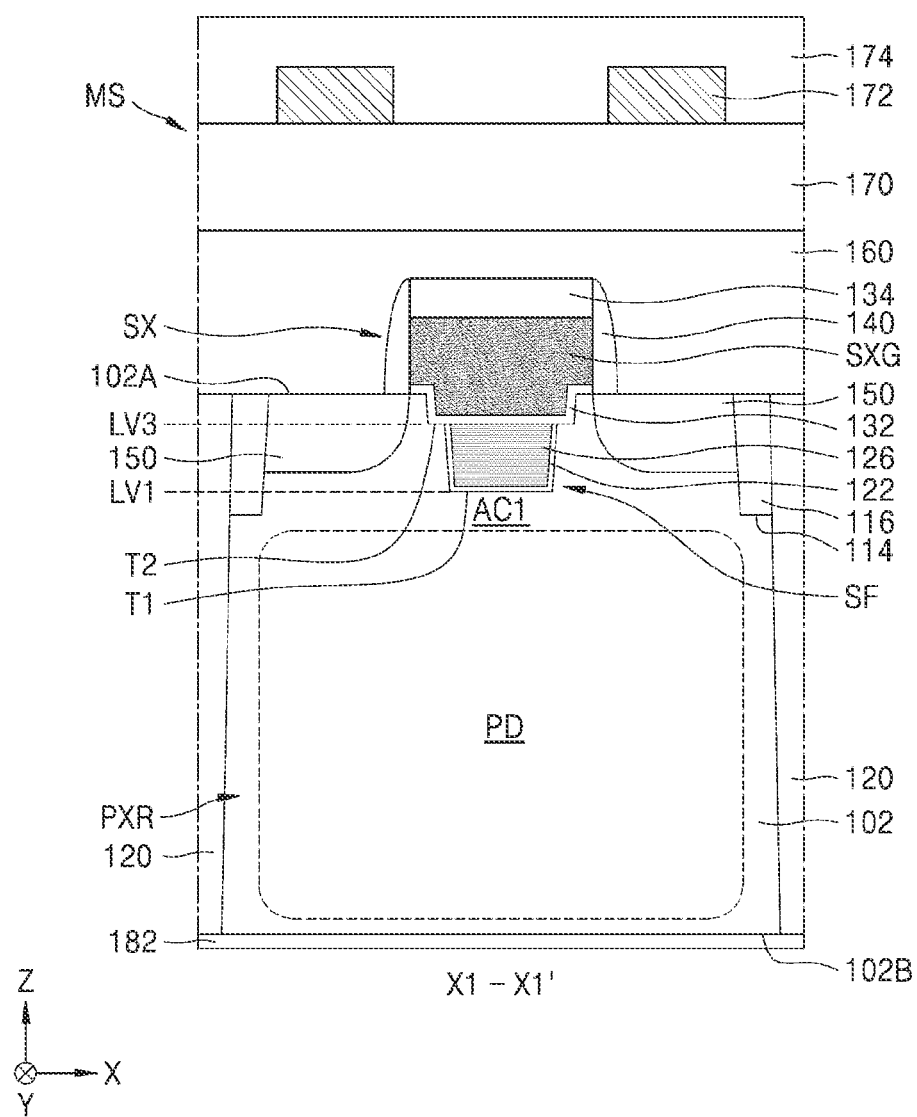
Figure 20B:
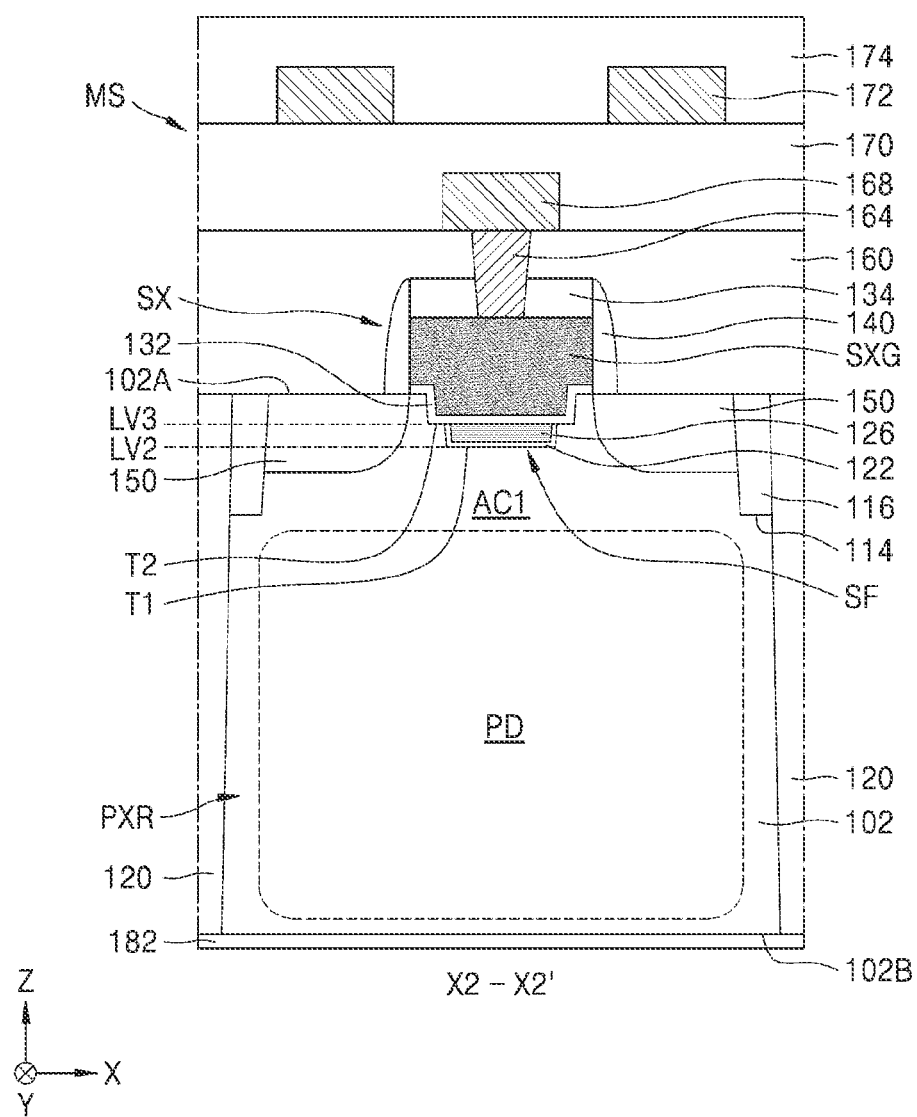
Figure 20C:
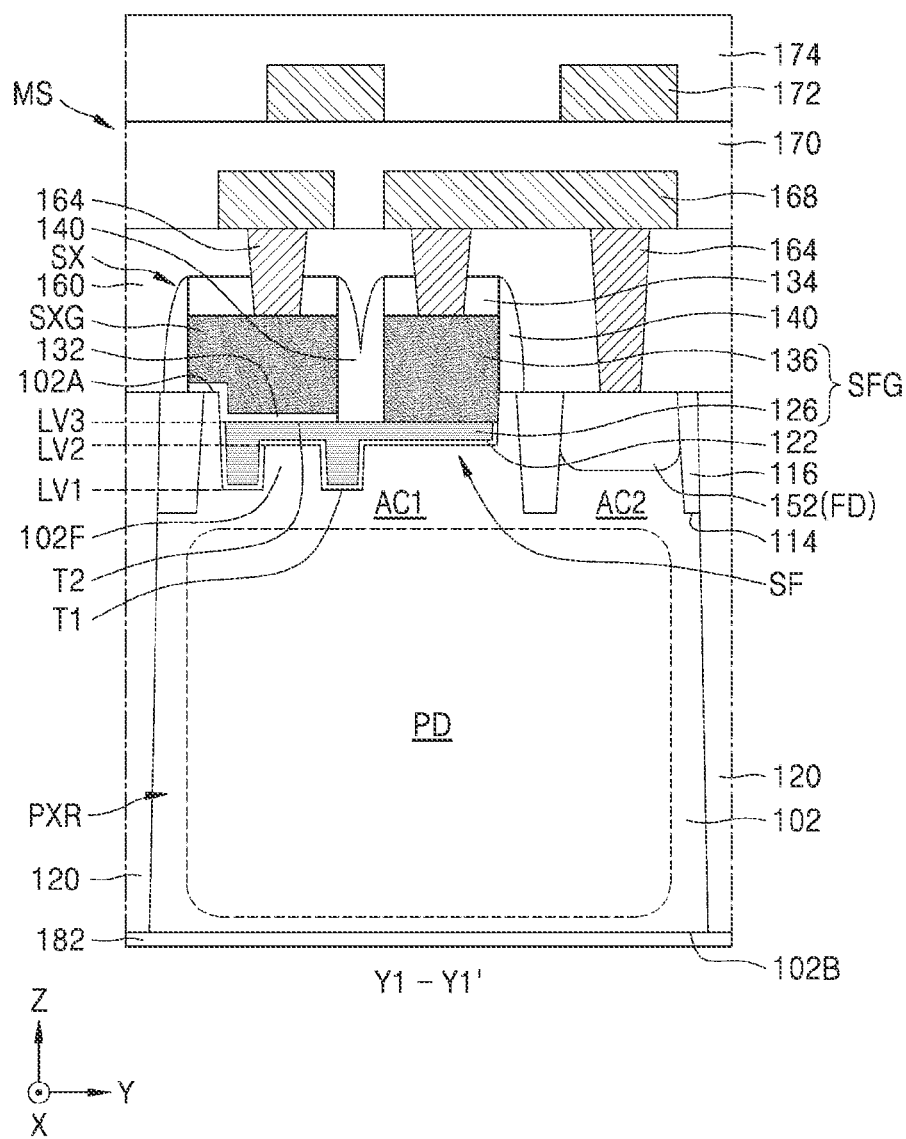

Referring to FIGS. 20A to 20C, a plurality of interlayer insulating films (e.g., 170 and 174) and a plurality of conductive lines 172 may be formed on the resultant structure of FIGS. 19A to 19C. The plurality of interlayer insulating films (e.g., 170 and 174) and the plurality of conductive lines 172 may constitute a wiring structure MS covering the front side surface 102A of the substrate 102, along with the interlayer insulating film 160 and the plurality of conductive lines 168.

After the wiring structure MS is formed, a thickness of the substrate 102 may be reduced while adhering a support substrate onto the wiring structure MS. To reduce the thickness of the substrate 102, a mechanical grinding process, a chemical mechanical polishing (CMP) process, a wet etching process, or a combination thereof may be used. As a result, the pixel isolation insulating film 120 may be exposed at a back side surface 102B, which is an opposite surface of the front side surface 102A of the substrate 102. A first planarization film 182 may be formed on an exposed back side surface 102B of the substrate 102 and an exposed surface of the pixel isolation insulating film 120.

Thereafter, as shown in FIGS. 5A to 5C, an anti-reflection film 186, a color filter CF, a second planarization film 184, a microlens ML, and a protective capping film 188 may be sequentially formed on the first planarization film 182 to form a light-transmitting structure LTS. Subsequently, the support substrate covering the wiring structure MS may be removed to manufacture the image sensor 100 shown in FIGS. 5A to 5C.

Although the method of manufacturing the image sensor 100 illustrated in FIGS. 4 and 5A to 5C has been described with reference to FIGS. 11A to 20C, embodiments are not limited thereto, and various modifications and changes may be made within the scope of the inventive concept to manufacture the image sensors 200, 300, 400, 500, and 600 described above with reference to FIGS. 6A to 10 according to embodiments of the inventive concept.

Figure 21A:
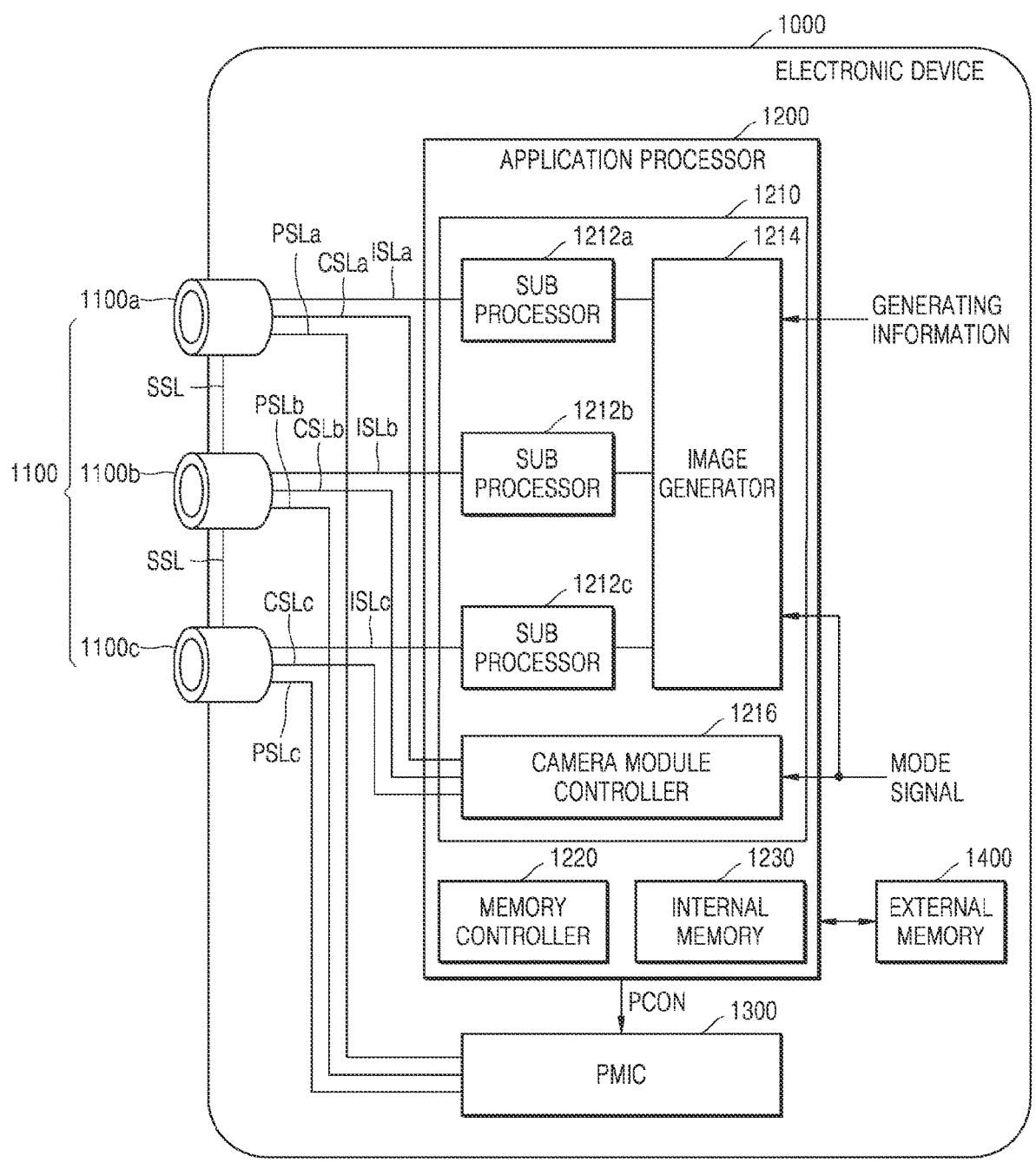
FIG. 21A is a block diagram of an electronic system according to embodiments of the inventive concept.
Figure 21B:
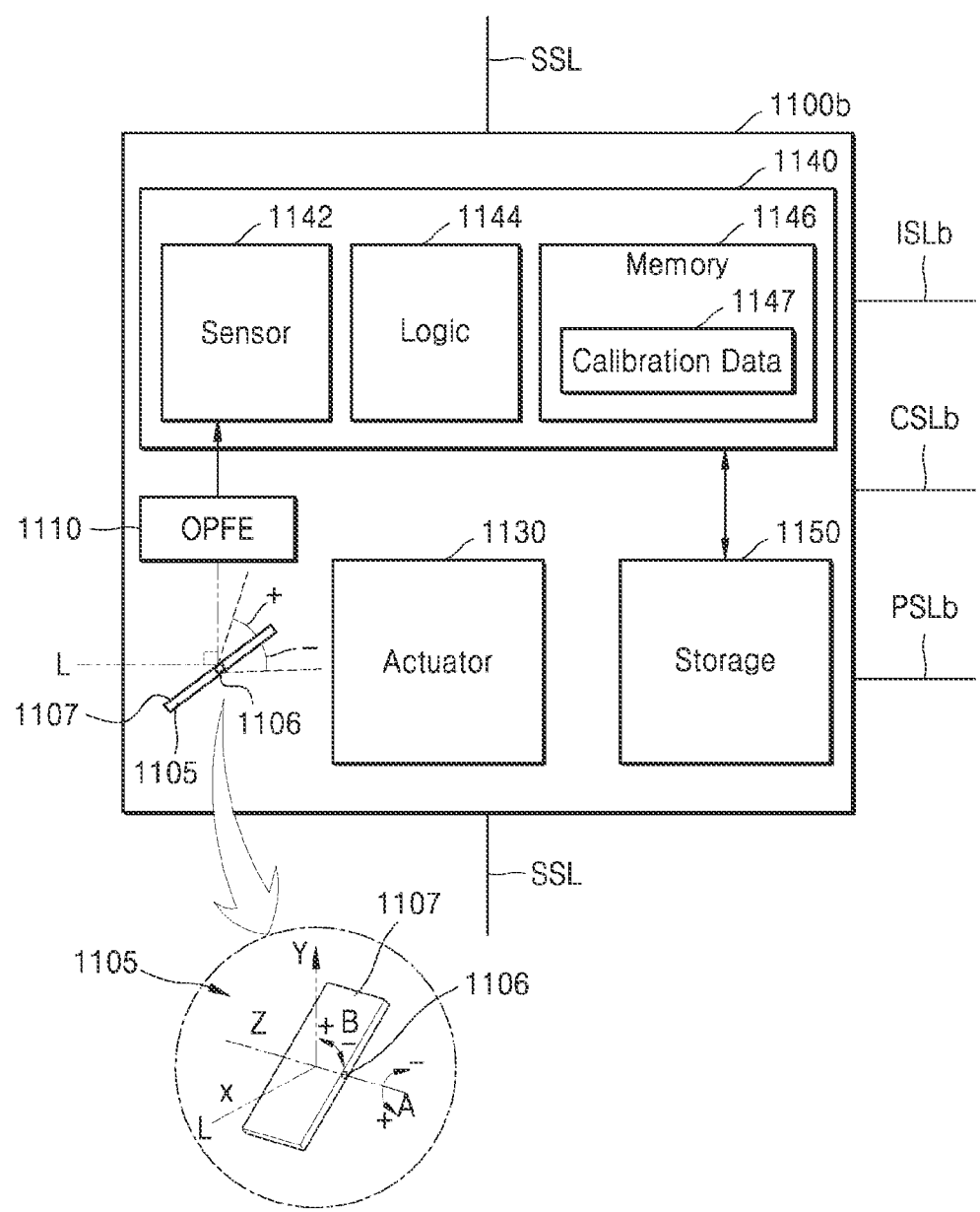
FIG. 21B is a detailed block diagram of a camera module included in the electronic system of FIG. 21A.

FIG. 21A is a block diagram of an electronic system 1000 according to embodiments of the inventive concept. FIG. 21B is a detailed block diagram of a camera module included in the electronic system 1000 of FIG. 21A.

Referring to FIG. 21A, the electronic system 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are illustrated in FIG. 21A, embodiments of the inventive concept are not limited thereto. In some embodiments, the camera module group 1100 may be modified to include only two camera modules. In some embodiments, the camera module group 1100 may be modified to include "n" camera modules, where "n" is a natural number of at least 4.

The detailed configuration of the camera module 1100b will be described with reference to FIG. 21B below. The descriptions below may also be applied to the other camera modules 1100a and 1100c.

Referring to FIG. 21B, the camera module 1100b may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from outside.

In some embodiments, the prism 1105 may change the path of the light L incident in a first direction (an X direction in FIG. 21B) into a second direction (a Y direction in FIG. 21B) perpendicular to the first direction. The prism 1105 may rotate the reflective surface 1107 of the light reflecting material in a direction A around a central shaft 1106 or rotate the central shaft 1106 in a direction B to change the path of the light L incident in the first direction (the X direction) into the second direction (the Y direction) perpendicular to the first direction (the X direction). In this case, the OPFE 1110 may move in a third direction (a Z direction in FIG. 21B), which is perpendicular to the first direction (the X direction) and the second direction (the Y direction).

In some embodiments, as illustrated in FIG. 21B, an A-direction maximum rotation angle of the prism 1105 may be less than or about equal to 15 degrees in a plus (+) A direction and greater than 15 degrees in a minus −□) A direction. However, embodiments of the inventive concept are not limited thereto.

In some embodiments, the prism 1105 may move by an angle of about 20 degrees or in a range from about 10 degrees to about 20 degrees or from about 15 degrees to about 20 degrees in a plus or minus B direction. In this case, an angle by which the prism 1105 moves in the plus B direction may be the same as or similar, within a difference of about 1 degree, to an angle by which the prism 1105 moves in the minus B direction.

In some embodiments, the prism 1105 may move the reflective surface 1107 of the light reflecting material in the third direction (the Z direction) parallel with an extension direction of the central shaft 1106.

The OPFE 1110 may include, for example, "m" optical lenses, where "m" is a natural number. The "m" lenses may move in the second direction (the Y direction) and change an optical zoom ratio of the camera module 1100b. For example, when the default optical zoom ratio of the camera module 1100b is Z, the optical zoom ratio of the camera module 1100b may be changed to 3 Z or 5 Z or greater by moving the "m" optical lenses included in the OPFE 1110.

The actuator 1130 may move the OPFE 1110 or an optical lens to a certain position. For example, the actuator 1130 may adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may sense an image of an object using the light L provided through the optical lens. The control logic 1144 may control all operations of the camera module 1100b. For example, the control logic 1144 may control operation of the camera module 1100b according to a control signal provided through a control signal line CSLb.

The memory 1146 may store information, such as calibration data 1147, utilized for the operation of the camera module 1100b. The calibration data 1147 may include information, which is utilized for the camera module 1100b, to generate image data using the light L provided from outside. For example, the calibration data 1147 may include information about the degree of rotation, information about a focal length, information about an optical axis, or the like. When the camera module 1100b is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some embodiments, although the storage 1150 may include electrically erasable programmable read-only memory (EEPROM), embodiments of the inventive concept are not limited thereto.

The image sensor 1142 may include the image sensor 100, 200, 300, 400, 500, or 600 described with reference to FIGS. 1 to 10, or an image sensor variously modified and changed therefrom within the scope of the inventive concept.

Referring to FIGS. 21A and 21B, in some embodiments, each of the camera modules 1100a, 1100b, and 1100c may include the actuator 1130. Accordingly, the camera modules 1100a, 1100b, and 1100c may include the calibration data 1147, which is the same or different among the camera modules 1100a, 1100b, and 1100c according to the operation of the actuator 1130 included in each of the camera modules 1100a, 1100b, and 1100c.

In some embodiments, one (e.g., the camera module 1100b) of the camera modules 1100a, 1100b, and 1100c may be of a folded-lens type including the prism 1105 and the OPFE 1110, while the other camera modules (e.g., the camera modules 1100a and 1100c) may be of a vertical type that does not include the prism 1105 and the OPFE 1110. However, embodiments of the inventive concept are not limited thereto.

In some embodiments, one (e.g., the camera module 1100c) of the camera modules 1100a, 1100b, and 1100c may include a vertical depth camera, which extracts depth information using an infrared (IR) ray. In this case, the application processor 1200 may generate a three-dimensional (3D) depth image by merging image data provided from the depth camera with image data provided from another camera module (e.g., the camera module 1100a or 1100b).

In some embodiments, at least two camera modules (e.g., 1100a and 1100b) among the camera modules 1100a, 1100b, and 1100c may have different field-of-views. In this case, for example, the two camera modules (e.g., 1100a and 1100b) among the camera modules 1100a, 1100b, and 1100c may respectively have different optical lenses. However, embodiments of the inventive concept are not limited thereto.

In some embodiments, the camera modules 1100a, 1100b, and 1100c may have different field-of-views from one another. In this case, although the camera modules 1100a, 1100b, and 1100c may respectively have different optical lenses, embodiments of the inventive concept are not limited thereto.

In some embodiments, the camera modules 1100a, 1100b, and 1100c may be physically separated from one another. In other words, the sensing area of the image sensor 1142 is not divided and used by the camera modules 1100a, 1100b, and 1100c, but the image sensor 1142 may be independently included in each of the camera modules 1100a, 1100b, and 1100c.

Referring back to FIG. 21A, the application processor 1200 may include an image processing unit 1210, a memory controller 1220, and an internal memory 1230. The application processor 1200 may be separately implemented from the camera modules 1100a, 1100b, and 1100c. For example, the application processor 1200 and the camera modules 1100a, 1100b, and 1100c may be implemented in different semiconductor chips.

The image processing unit 1210 may include a plurality of sub-processors 1212a, 1212b, and 1212c, an image generator 1214, and a camera module controller 1216. The image processing unit 1210 may include as many sub-processors 1212a, 1212b, and 1212c as the camera modules 1100a, 1100b, and 1100c.

Pieces of image data respectively generated by the camera modules 1100a, 1100b, and 1100c may be respectively provided to the sub-processors 1212a, 1212b, and 1212c through image signal lines ISLa, ISLb, and ISLc separated from each other. For example, image data generated by the camera module 1100a may be provided to the sub-processor 1212a through the image signal line ISLa, image data generated by the camera module 1100b may be provided to the sub-processor 1212b through the image signal line ISLb, and image data generated by the camera module 1100c may be provided to the sub-processor 1212c through the image signal line ISLc. Such image data transmission may be performed using, for example, a mobile industry processor interface (MIPI) based camera serial interface (CSI). However, embodiments of the inventive concept are not limited thereto.

In some embodiments, a single sub-processor may be provided for a plurality of camera modules. For example, differently from FIG. 13, in an embodiment, the sub-processors 1212a and 1212c may not be separated but may be integrated into a single sub-processor, and the image data provided from the camera module 1100a or the camera module 1100c may be selected by a selection element (e.g., a multiplexer) and then provided to the integrated sub-processor.

The image data provided to each of the sub-processors 1212a, 1212b, and 1212c may be provided to the image generator 1214. The image generator 1214 may generate an output image using the image data provided from each of the sub-processors 1212a, 1212b, and 1212c according to image generation information or a mode signal.

For example, the image generator 1214 may generate the output image by merging at least portions of respective pieces of image data, which are respectively generated by the camera modules 1100a, 1100b, and 1100c having different field-of-views, according to the image generation information or the mode signal. Alternatively, the image generator 1214 may generate the output image by selecting one of pieces of image data, which are respectively generated by the camera modules 1100a, 1100b, and 1100c having different field-of-views, according to the image generation information or the mode signal.

In some embodiments, the image generation information may include a zoom signal or a zoom factor. In some embodiments, the mode signal may be based on a mode selected by a user.

When the image generation information includes a zoom signal or a zoom factor and the camera modules 1100a, 1100b, and 1100c have different field-of-views, the image generator 1214 may perform different operations according to different kinds of zoom signals. For example, when the zoom signal is a first signal, the image generator 1214 may merge image data output from the camera module 1100a and image data output from the camera module 1100c and then generate an output image by using a merged image signal and image data output from the camera module 1100b and not used for merging. When the zoom signal is a second signal different from the first signal, the image generator 1214 may generate an output image by selecting one of the pieces of image data respectively output from the camera modules 1100a, 1100b, and 1100c, instead of performing the merging. However, embodiments of the inventive concept are not limited thereto, and a method of processing image data may be changed according to embodiments.

In some embodiments, the image generator 1214 may receive a plurality of pieces of image data, which have different exposure times, from at least one of the sub-processors 1212a, 1212b, and 1212c, and perform high dynamic range (HDR) processing on the pieces of image data, thereby generating merged image data having an increased dynamic range.

The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through a corresponding one of control signal lines CSLa, CSLb, and CSLc, which are separated from one another.

One (e.g., the camera module 1100b) of the camera modules 1100a, 1100b, and 1100c may be designated as a master camera according to the mode signal or the image generation signal including a zoom signal, and the other camera modules (e.g., the camera modules 1100a and 1100c) may be designated as slave cameras. Such designation information may be included in a control signal and provided to each of the camera modules 1100a, 1100b, and 1100c through a corresponding one of the control signal lines CSLa, CSLb, and CSLc, which are separated from one another.

A camera module operating as a master or a slave may be changed according to a zoom factor or an operation mode signal. For example, when the field-of-view of the camera module 1100a is greater than that of the camera module 1100b and the zoom factor indicates a low zoom ratio, the camera module 1100a may operate as a master and the camera module 1100b may operate as a slave. In contrast, when the zoom factor indicates a high zoom ratio, the camera module 1100b may operate as a master and the camera module 1100a may operate as a slave.

In some embodiments, a control signal provided from the camera module controller 1216 to each of the camera modules 1100a, 1100b, and 1100c may include a sync enable signal. For example, when the camera module 1100b is a master camera and the camera module 1100a is a slave camera, the camera module controller 1216 may transmit the sync enable signal to the camera module 1100b. The camera module 1100b provided with the sync enable signal may generate a sync signal based on the sync enable signal and may provide the sync signal to the camera modules 1100a and 1100c through a sync signal line SSL. The camera modules 1100a, 1100b, and 1100c may be synchronized with the sync signal and may transmit image data to the application processor 1200.

In some embodiments, a control signal provided from the camera module controller 1216 to each of the camera modules 1100a, 1100b, and 1100c may include mode information according to the mode signal. The camera modules 1100a, 1100b, and 1100c may operate in a first operation mode or a second operation mode in relation with a sensing speed based on the mode information.

In the first operation mode, the camera modules 1100a, 1100b, and 1100c may generate an image signal at a first speed (e.g., at a first frame rate), encode the image signal at a second speed higher than the first speed (e.g., at a second frame rate higher than the first frame rate), and transmit an encoded image signal to the application processor 1200. In this case, the second speed may be about 30 times or less the first speed.

The application processor 1200 may store the received image signal, e.g., the encoded image signal, in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub-processors 1212a, 1212b, and 1212c of the image processing unit 1210 may perform the decoding and may also perform image processing on the decoded image signal.

In the second operation mode, the camera modules 1100a, 1100b, and 1100c may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a power supply voltage, to each of the camera modules 1100a, 1100b, and 1100c. For example, under the control of the application processor 1200, the PMIC 1300 may provide first power to the camera module 1100a through a power signal line PSLa, second power to the camera module 1100b through a power signal line PSLb, and third power to the camera module 1100c through a power signal line PSLc.

The PMIC 1300 may generate power corresponding to each of the camera modules 1100a, 1100b, and 1100c and adjust the level of the power, in response to a power control signal PCON from the application processor 1200. The power control signal PCON may include a power adjustment signal for each operation mode of the camera modules 1100a, 1100b, and 1100c. For example, the operation mode may include a low-power mode. In this case, the power control signal PCON may include information about a camera module to operate in the low-power mode and a power level to be set. The same or different levels of power may be respectively provided to the camera modules 1100a, 1100b, and 1100c. The level of power may be dynamically changed.

As is traditional in the field of the present inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to the embodiments thereof, it will be understood by those of ordinary skill in the art that various changes in form and detail may be made therein without departing from the spirit and scope of the inventive concept as defined by the following claims.

What is claimed is:

1. An image sensor, comprising:
   a substrate having a pixel area in which a plurality of active areas is defined;
   a first transistor comprising a first gate electrode comprising a buried gate portion,
   wherein the buried gate portion is buried in the substrate in a first active area selected from the plurality of active areas; and
   a second transistor comprising a second gate electrode overlapping the buried gate portion on the first active area in a vertical direction.

2. The image sensor of claim 1, further comprising:
   a first impurity region and a second impurity region in the first active area,
   wherein the first impurity region and the second impurity region are spaced apart from each other in a lateral direction with the first gate electrode and the second gate electrode therebetween,
   wherein the first impurity region and the second impurity region operate as a source and a drain of each of the first transistor and the second transistor.

3. The image sensor of claim 1, wherein the first gate electrode further comprises an upper gate portion protruding in the vertical direction from a top surface of the buried gate portion to a level higher than a level of a front side surface of the substrate,
   wherein the upper gate portion of the first gate electrode is spaced apart from the second gate electrode in a lateral direction, and the upper gate portion of the first gate electrode faces the second gate electrode in the lateral direction.

4. The image sensor of claim 1, wherein the first transistor further comprises a first gate dielectric film between the first active area and the buried gate portion,
   the second transistor further comprises a second gate dielectric film between the first active area and the second gate electrode and between the first gate electrode and the second gate electrode, and
   a thickness of the second gate dielectric film is greater than a thickness of the first gate dielectric film.

5. The image sensor of claim 1, wherein the first transistor further comprises a first gate dielectric film between the first active area and the buried gate portion,
   the second transistor further comprises a second gate dielectric film between the first active area and the second gate electrode and between the first gate electrode and the second gate electrode, and
   the second gate electrode is spaced apart from the buried gate portion in the vertical direction with the second gate dielectric film therebetween.

6. The image sensor of claim 1, wherein a width of the buried gate portion of the first gate electrode is less than a width of the second gate electrode in a lateral direction.

7. The image sensor of claim 1, wherein the first active area comprises a fin region protruding toward the buried gate portion, and
   the buried gate portion comprises a protrusion covering a sidewall of the fin region.

8. The image sensor of claim 1, further comprising:
a photodiode formed in the substrate,
wherein the first gate electrode and the second gate electrode overlap the photodiode in the vertical direction.

9. The image sensor of claim 1, wherein each of the first gate electrode and the second gate electrode comprises doped polysilicon, and
a dopant concentration of the second gate electrode is higher than a dopant concentration of the buried gate portion of the first gate electrode.

10. The image sensor of claim 1, further comprising:
a floating diffusion region formed in a second active area,
wherein the second active area is selected from the plurality of active areas and spaced apart from the first active area,
wherein the first gate electrode and the floating diffusion region are electrically connected to each other.

11. The image sensor of claim 1, further comprising:
an upper gate portion constituting a portion of the first gate electrode,
wherein the upper gate portion protrudes in the vertical direction from a top surface of the buried gate portion to a level higher than a level of a front side surface of the substrate;
a floating diffusion region formed in a second active area selected from the plurality of active areas and spaced apart from the first active area;
a first contact plug connected to the upper gate portion;
a second contact plug connected to the floating diffusion region; and
a conductive line disposed on and connected to each of the first contact plug and the second contact plug.

12. An image sensor, comprising:
a substrate comprising a front side surface and a back side surface,
wherein the front side surface and the back side surface are opposite surfaces, and the substrate comprises a plurality of active areas defined at positions adjacent to the front side surface between the front side surface and the back side surface;
a photodiode formed in the substrate;
a source follower transistor disposed in a first active area selected from the plurality of active areas,
wherein the source follower transistor comprises a first gate electrode, the first gate electrode comprises a buried gate portion buried in the substrate and an upper gate portion in contact with the buried gate portion, and the upper gate portion overlaps a first region of the buried gate portion in a vertical direction;
a selection transistor comprising a second gate electrode overlapping a second region of the buried gate portion on the first active area in the vertical direction;
a transfer transistor formed in a second active area selected from the plurality of active areas;
a floating diffusion region formed in the second active area,
wherein the floating diffusion region is connected to the upper gate portion of the source follower transistor; and
a microlens covering the back side surface of the substrate.

13. The image sensor of claim 12, further comprising:
a first impurity region and a second impurity region disposed in the first active area,
wherein the first impurity region and the second impurity region are spaced apart from each other in a lateral direction with the first gate electrode and the second gate electrode therebetween,
wherein the first impurity region and the second impurity region operate as a source and a drain of each of the source follower transistor and the selection transistor.

14. The image sensor of claim 12, further comprising:
a first impurity region and a second impurity region disposed in the first active area,
wherein the first impurity region and the second impurity region are spaced apart from each other in a first lateral direction with the first gate electrode and the second gate electrode therebetween,
wherein the upper gate portion of the source follower transistor and the second gate electrode of the selection transistor are spaced apart from each other in a second lateral direction, the second lateral direction being perpendicular to the first lateral direction, and
a width of the buried gate portion is less than a width of the second gate electrode in the first lateral direction.

15. The image sensor of claim 12, wherein the first active area comprises a fin region having a top surface and sidewalls facing the buried gate portion, and
the source follower transistor further comprises a gate dielectric film between the buried gate portion and the fin region.

16. The image sensor of claim 12, wherein the buried gate portion overlaps the photodiode in the vertical direction.

17. The image sensor of claim 12, wherein each of the buried gate portion and the upper gate portion of the source follower transistor and the second gate electrode of the selection transistor comprises doped polysilicon, and
a dopant concentration of each of the second gate electrode and the upper gate portion is higher than a dopant concentration of the buried gate portion.

18. The image sensor of claim 12, wherein the selection transistor has a dual-gate-type structure in which channels are respectively formed on both sides of the buried gate portion.

19. The image sensor of claim 12, wherein a portion of the upper gate portion and a portion of the second gate electrode are buried in the substrate.

20. An electronic system, comprising:
at least one camera module comprising an image sensor; and
a processor configured to process image data received from the at least one camera module,
wherein the image sensor comprises:
a substrate having a pixel area in which a plurality of active areas is defined;
a first transistor comprising a first gate electrode comprising a buried gate portion,
wherein the buried gate portion is buried in the substrate in a first active area selected from the plurality of active areas; and
a second transistor comprising a second gate electrode overlapping the buried gate portion on the first active area in a vertical direction.

* * * * *